United States Patent
Kang

(10) Patent No.: US 12,063,824 B2
(45) Date of Patent: Aug. 13, 2024

(54) DISPLAY DEVICE HAVING DATA LINES CONNECTED TO DIFFERENT PIXEL COLUMNS ON ONE SIDE OF NON-DISPLAY AREA

(71) Applicant: SAMSUNG DISPLAY CO., LTD., Yongin-si (KR)

(72) Inventor: Dohyun Kang, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 649 days.

(21) Appl. No.: 17/242,450

(22) Filed: Apr. 28, 2021

(65) Prior Publication Data
US 2021/0408210 A1    Dec. 30, 2021

(30) Foreign Application Priority Data

Jun. 29, 2020  (KR) .......................... 10-2020-0079294

(51) Int. Cl.
*H10K 59/131*    (2023.01)
*H10K 77/10*    (2023.01)
*H10K 59/35*    (2023.01)

(52) U.S. Cl.
CPC .......... *H10K 59/131* (2023.02); *H10K 77/10* (2023.02); *H10K 59/35* (2023.02)

(58) Field of Classification Search
CPC ..................................................... H10K 77/10
See application file for complete search history.

(56) References Cited

U.S. PATENT DOCUMENTS

| 8,681,083 | B2 * | 3/2014 | Kang ................ G02F 1/136286 345/55 |
| 9,622,342 | B2 | 4/2017 | Kim et al. |
| 2011/0187682 | A1 * | 8/2011 | Kim ..................... G09G 3/3614 345/204 |
| 2015/0061986 | A1 * | 3/2015 | Song ................ G02F 1/136286 345/90 |
| 2017/0162637 | A1 * | 6/2017 | Choi ....................... H01L 21/28 |

FOREIGN PATENT DOCUMENTS

| CN | 108831365 A | * 11/2018 | .......... G09G 3/2074 |
| KR | 10-2015-0085668 | 7/2015 | |
| KR | 10-1774579 | 9/2017 | |

* cited by examiner

*Primary Examiner* — Lex H Malsawma
(74) *Attorney, Agent, or Firm* — F. Chau & Associates, LLC

(57) ABSTRACT

A display panel includes a first area in which first pixels of a first pixel column, second pixels of a second pixel column, and third pixels of a third pixel column are arranged, a second area which cuts off each of the first pixel column, the second pixel column, and the third pixel column and through which an optical signal travels, and first to third data lines. The first data line is connected to the first pixels and a portion of the third pixels arranged on one side of the second area in a direction in which the pixel columns extend, the second data line is connected to the second pixels, and the third data line is connected to a remaining portion of the third pixels arranged on the other side of the second area in the direction in which the pixel columns extend.

23 Claims, 14 Drawing Sheets

DISPLAY DEVICE HAVING DATA LINES CONNECTED TO DIFFERENT PIXEL COLUMNS ON ONE SIDE OF NON-DISPLAY AREA

CROSS-REFERENCE TO RELATED APPLICATIONS

This U.S. non-provisional patent application claims priority under 35 U.S.C. § 119 to Korean Patent Application No. 10-2020-0079294, filed on Jun. 29, 2020, the disclosure of which is herein incorporated by reference in its entirety.

TECHNICAL FIELD

Embodiments of the present disclosure relate to a display device, and more particularly, to a display device that includes a signal transmission area through which an optical signal travels.

DISCUSSION OF RELATED ART

As advancements in mobile electronic apparatuses are made, and as the functions of mobile electronic apparatuses become more diverse, there is a growing demand for mobile electronic devices having a larger display area and a smaller non-display area.

SUMMARY

The present disclosure provides a display device having a relatively wide display area and a relatively narrow non-display area.

An embodiment of the inventive concept provides a display panel that includes a first area in which first pixels of a first pixel column, second pixels of a second pixel column, and third pixels of a third pixel column are arranged, and a second area which cuts off the first pixel column, the second pixel column, and the third pixel column and through which an optical signal travels. The display panel includes a first data line which is connected to the first pixels and a portion of the third pixels arranged on one side of the second area in a direction in which the pixel columns extend, a second data line connected to the second pixels, and a third data line which is connected to a remaining portion of the third pixels arranged on the other side of the second area in the direction in which the pixel columns extend.

In an embodiment, the display panel may further include a first scan line connected to one first pixel of the first pixels arranged on the one side of the second area in the direction in which the pixel columns extend and one third pixel of the third pixels arranged on the one side of the second area in the direction in which the pixel columns extend, and a second scan line connected to one first pixel of the first pixels arranged on the other side of the second area in the direction in which the pixel columns extend and one third pixel of the third pixels arranged on the other side of the second area in the direction in which the pixel columns extend.

In an embodiment, the one first pixel and the one third pixel, which are connected to the first scan line, may display the same color.

In an embodiment, the second pixels may display a different color from that of the one first pixel and the one third pixel.

In an embodiment, the second area may include a signal transmission area through which the optical signal is transmitted and a peripheral area adjacent to the signal transmission area. A portion of the first data line may overlap the peripheral area.

In an embodiment, the signal transmission area may pass through the display panel.

In an embodiment, the display panel may include a base layer, at least one insulating layer disposed on the base layer and overlapping the first data line, the second data line, and the third data line, and a display element layer disposed on the at least one insulating layer. A thickness of the signal transmission area of the display panel may be less than a thickness of the peripheral area.

In an embodiment, the display panel may further include an encapsulation substrate that seals the display element layer.

In an embodiment, the first data line may include a connection part disposed in the peripheral area, a first part which is connected to the connection part, disposed on the one side of the second area, and connected to a portion of the first pixels, a second part which is connected to the connection part, disposed on the one side of the second area, and connected to the portion of the third pixels, and a third part which is connected to the connection part, disposed on the other side of the second area, and connected to the remaining portion of the first pixels.

In an embodiment, the first part, the second part, and the third part may be disposed on the same layer.

In an embodiment, the connection part may be disposed on a layer different from that of the first part.

In an embodiment, the first pixel column, the second pixel column, and the third pixel column may be sequentially arranged in a pixel row direction perpendicular to the direction in which the pixel columns extend, and the display panel further may include a fourth pixel column which is adjacent to the third pixel column and includes fourth pixels. The second data line may be connected to a portion of the fourth pixels arranged on the one side of the second area in the direction in which the pixel columns extend.

In an embodiment, the second pixels and the fourth pixels may display the same color.

In an embodiment, one of the second pixels and one of the fourth pixels may be connected to a first scan line to define a first pixel row, one of the first pixels and one of the third pixels may be connected to a second scan line to define a second pixel row, another one of the second pixels and another one of the fourth pixels may be connected to a third scan line to define a third pixel row, and another one of the first pixels and another one of the third pixels may be connected to a fourth scan line to define a fourth pixel row. The first pixel row to the fourth pixel row are spaced apart from each other in the direction in which the pixel columns extend.

In an embodiment, in a plan view, the second area may be surrounded by the first area.

In an embodiment, the first pixels and the third pixels may include a first type of pixels configured to display a first color and a second type of pixels configured to display a second color, and a pixel arrangement of the first pixels and a pixel arrangement of the third pixels may be different from each other in the direction in which the pixel columns extend.

In an embodiment of the inventive concept, a display panel includes a first area in which pixels are arranged, and a second area which has a light transmittance higher than that of the first area and in which pixels are not arranged. The display panel may include a first data line which is connected to pixels arranged on the other side of the second area and pixels arranged on the other side of the second area in a first direction, and a second data line which is connected to pixels arranged on the one side of the second area. A portion of the pixels, which are connected to the first data line and arranged on the one side of the second area, may define the same pixel column as the pixels which are connected to the second data line and arranged on the other side of the second area.

In an embodiment, a portion of the first data line may overlap the second area.

In an embodiment, the second area may include a signal transmission area passing through the display panel and a peripheral area adjacent to the signal transmission area.

In an embodiment, the number of pixels connected to the first data line may be greater than the number of pixels connected to the second data line.

BRIEF DESCRIPTION OF THE DRAWINGS

The above and other features of the present inventive concept will become more apparent by describing in detail embodiments thereof with reference to the accompanying drawings, in which.

DETAILED DESCRIPTION

Figure 1:
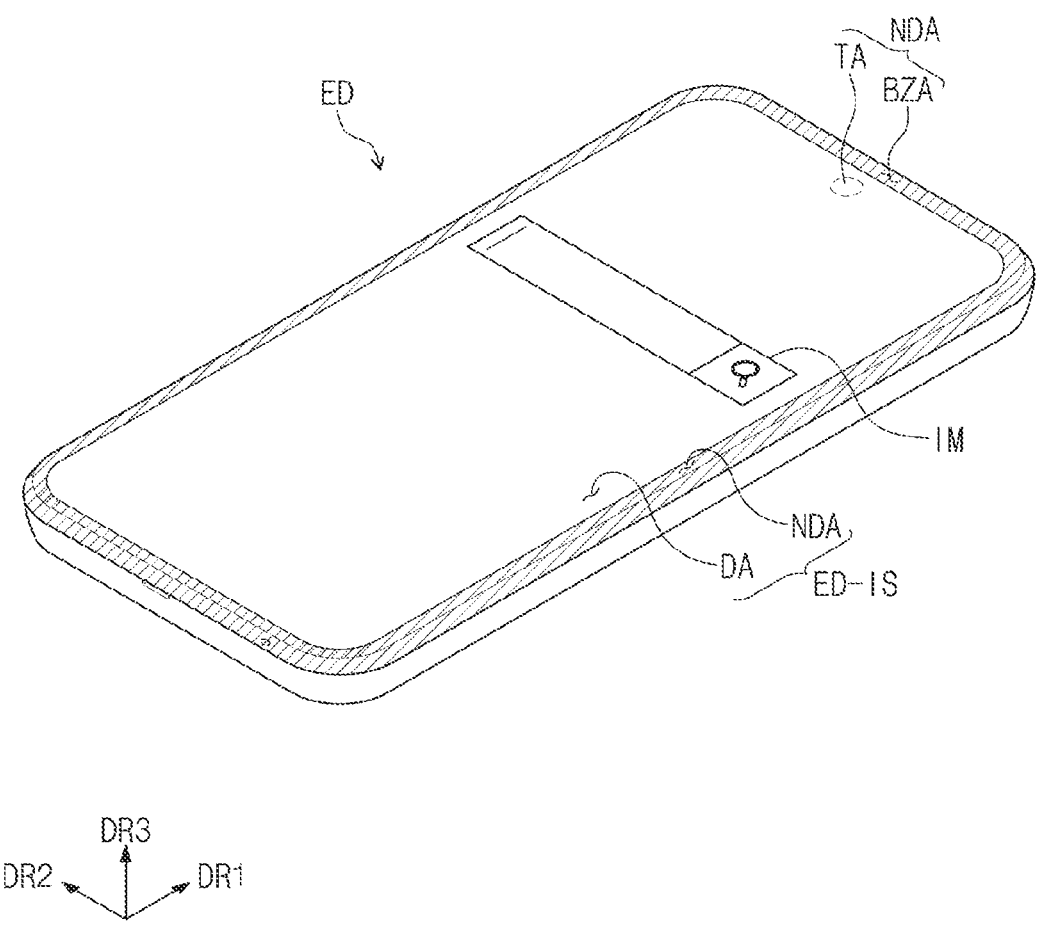
FIG. 1 is a perspective view of an electronic apparatus according to an embodiment of the inventive concept.

Embodiments of the present inventive concept will be described more fully hereinafter with reference to the accompanying drawings. Like reference numerals may refer to like elements throughout the accompanying drawings. The term "and/or" includes any and all combinations of one or more of the associated listed items.

It will be understood that, although the terms "first", "second", etc. may be used herein to describe various elements, these elements should not be limited by these terms. These terms are only used to distinguish one element from another element. For example, a "first" element may be referred to as a "second" element, and similarly, a "second" element may be referred to as a "first" element without departing from the scope of the present disclosure. The singular forms are intended to include the plural forms as well unless the context clearly indicates otherwise.

Also, terms such as "below", "lower", "above", and "upper" may be used to describe the relationships of the components illustrated in the drawings. These terms have a relative concept, and are described on the basis of the directions indicated in the drawings.

It will be understood that the term "includes" or "comprises", when used in this specification, specify the presence of stated features, integers, steps, operations, elements, components, or a combination thereof, but do not preclude the presence or addition of one or more other features, integers, steps, operations, elements, components, or combinations thereof.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationship between components should be interpreted in a like fashion.

It should be understood that descriptions of features or aspects within each embodiment should typically be considered as available for other similar features or aspects in other embodiments, unless the context clearly indicates otherwise.

Figure 2:
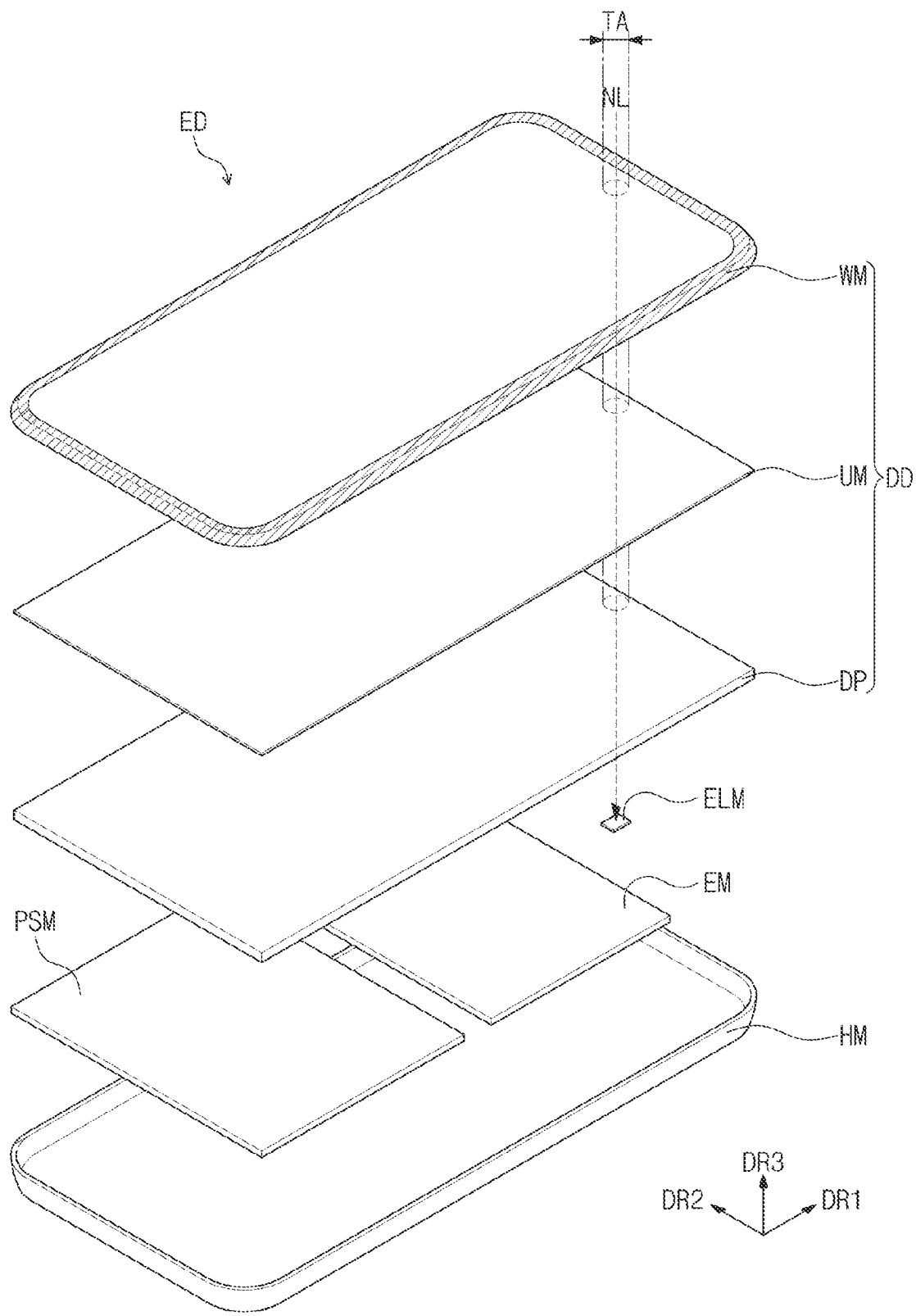
FIG. 2 is an exploded perspective view of an electronic apparatus according to an embodiment of the inventive concept.
Figure 3:
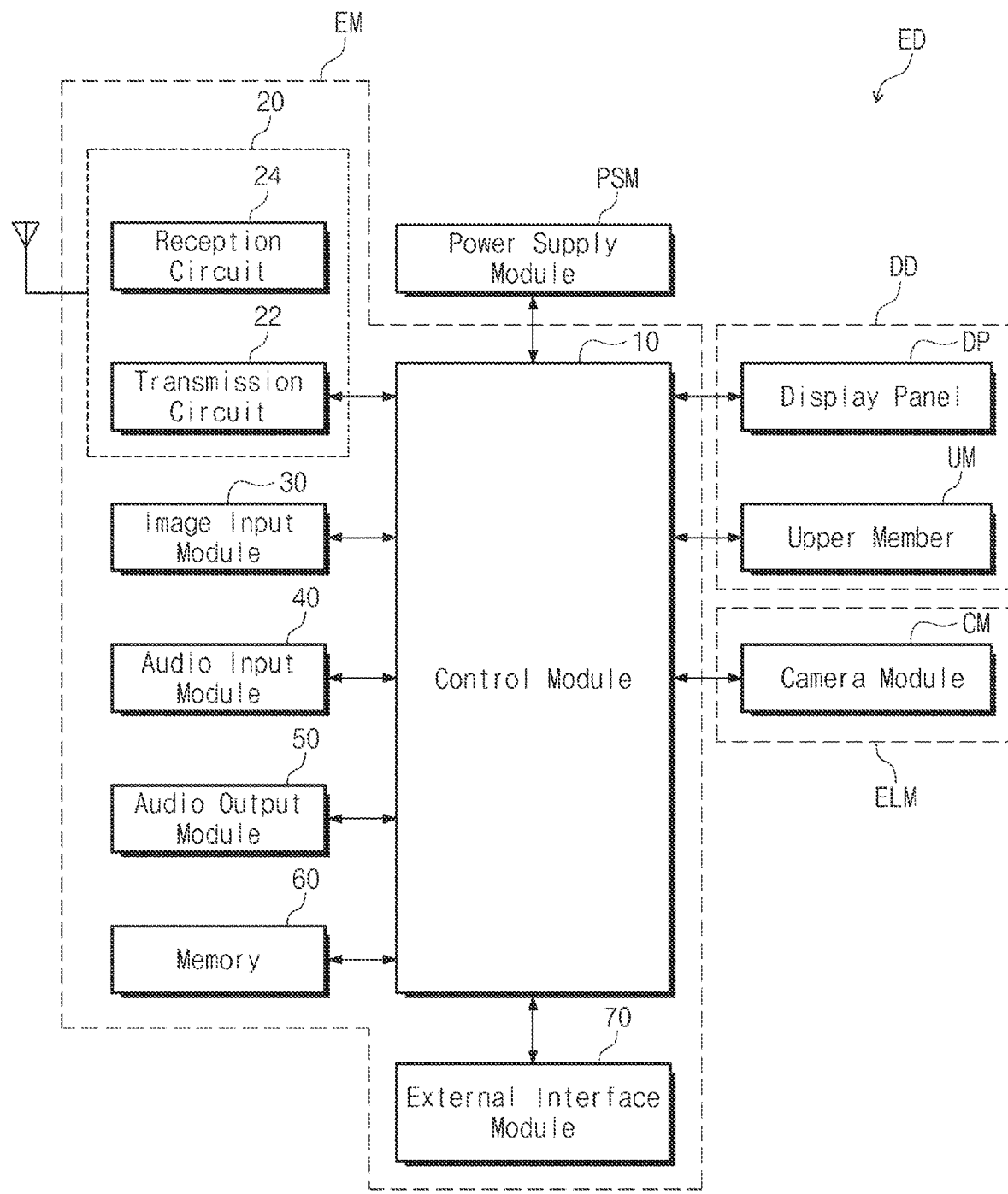
FIG. 3 is a block diagram of an electronic apparatus according to an embodiment of the inventive concept.

FIG. 1 is a perspective view of an electronic apparatus ED according to an embodiment of the inventive concept. FIG. 2 is an exploded perspective view of an electronic apparatus ED according to an embodiment of the inventive concept. FIG. 3 is a block diagram of an electronic apparatus ED according to an embodiment of the inventive concept.

As illustrated in FIG. 1, the electronic apparatus ED may display an image IM through a display surface ED-IS. The display surface ED-IS is parallel to a plane defined by a first direction axis DR1 and a second direction axis DR2. A normal direction of the display surface ED-IS, that is, a thickness direction of the electronic apparatus ED, is indicated as a third direction axis DR3. The display surface ED-IS of the electronic apparatus ED corresponds to a front surface of the electronic apparatus ED, and may correspond to a top surface of a window WM.

A front surface (or a top surface) and a rear surface (or a bottom surface) of each of various components described below may be relative to the third direction axis DR3. However, the first to third direction axes DR1, DR2, and DR3 illustrated are merely examples. Hereinafter, first to third directions are defined as the directions indicated by the first to third direction axes DR1, DR2, and DR3, respectively, and may be referred to using the same reference symbols.

The display surface ED-IS includes a display area DA and a non-display area NDA adjacent to the display area DA. The display area DA is an area in which an image is displayed, and the non-display area NDA is an area in which an image is not displayed. The non-display area NDA may include a first non-display area BZA and a second non-display area TA.

The first non-display area BZA may be an area which blocks an optical signal, and which is disposed outside the display area DA and surrounds the display area DA. In an embodiment, the first non-display area BZA may be disposed on the front surface of the electronic apparatus ED. In an embodiment, the first non-display area BZA may be disposed on a side surface of the electronic apparatus ED. In an embodiment, the first non-display area BZA may be omitted.

The first non-display area BZA surrounding the display area DA is not limited to the configuration shown in FIGS. 1 and 2. For example, according to embodiments, the first non-display area BZA may be disposed on one side of the display area DA, or only in areas facing each other in the first direction DR1.

The second non-display area TA may be an area thought which an optical signal is transmitted. Although only one second non-display area TA is illustratively shown in FIGS. 1 and 2, the present inventive concept is not limited thereto. For example, in an embodiment, a plurality of second non-display areas TA may be provided. Here, the optical signal may be external natural light or light generated from a light emitting element, for example, infrared light.

In an embodiment, the second non-display area TA may be surrounded by the display area DA. Hereinafter, the display area DA is defined as a first area, and the second non-display area TA is defined as a second area. In an embodiment of the inventive concept, a portion of the second non-display area TA may be extended from the first non-display area BZA.

In FIGS. 1 and 2, the display surface ED-IS is illustratively shown to be flat. However, the present inventive concept is not limited thereto. For example, according to an embodiment, curved sections may be disposed on both sides of the display surface ED-IS facing each other in the second direction DR2.

In FIGS. 1 and 2, a mobile phone is illustratively shown as being the electronic apparatus ED. However, the electronic apparatus ED is not limited to thereto. For example, according to embodiments, the electronic device ED may be any one of various devices that provide information including, for example, televisions, navigation devices, computer monitors, game consoles, etc.

As illustrated in FIGS. 2 and 3, the electronic apparatus ED may include a display device DD, an electronic module EM, an electronic optical module ELM, a power supply module PSM, and a housing HM.

The display device DD generates an image. The display device DD includes a display panel DP, an upper member UM, and a window WM. Areas corresponding to the display area DA, the first non-display area BZA, and the second non-display area TA of the electronic apparatus ED are defined in the display device DD.

The display panel DP may be, for example, a light emitting display panel such as an organic light emitting display panel or a quantum-dot light emitting display panel. However, the display panel DP is not limited thereto.

Depending on the configuration of the upper member UM, the display device DD may sense an external input and/or external pressure. The upper member UM may include various members.

For example, in an embodiment, the upper member UM may include an optical film and an input detection sensor. The optical film reduces reflectivity of external light. The input detection sensor senses an external input of a user. The upper member UM may further include an adhesive layer that couples the optical film and the input detection sensor.

The optical film may include a polarizer and a phase retarder. The polarizer and the phase retarder may be a stretching-type or a coating-type. The input detection sensor may sense the external input through, for example, a capacitive method, a pressure detection method, or a magnetic induction method.

The window WM provides an exterior surface of the electronic apparatus ED. The window WM includes a base substrate and may further include functional layers such as an anti-reflection layer and an anti-fingerprint layer.

The display device DD may further include at least one adhesive layer. The adhesive layer may couple the window WM and the upper member UM, or couple the upper member UM and the display panel DP. The adhesive layer may be an optically clear adhesive layer or a pressure sensitive adhesive.

The electronic module EM may include a control module 10, a wireless communication module 20, an image input module 30, an audio input module 40, an audio output module 50, a memory 60, an external interface module 70, etc. These modules may be mounted to the circuit board or electrically connected through a flexible circuit board. The electronic module EM is electrically connected to the power supply module PSM.

The control module 10 controls overall operations of the electronic apparatus ED. For example, the control module 10 activates or deactivates the electronic apparatus ED in response to a user's input. The control module 10 may control the image input module 30, the audio input module 40, the audio output module 50, etc. in response to the user's input. The control module 10 may include at least one microprocessor.

The wireless communication module 20 may receive and transmit a wireless signal from and to another terminal by using, for example, BLUETOOTH or WI-FI. For example, the wireless communication module 20 may be a BLUETOOTH module or a WI-FI module. The wireless communication module 20 may receive and transmit an audio signal by using a general communication line. The wireless communication module 20 includes a transmission circuit 22 which modulates a signal to be transmitted and transmits the signal, and a reception circuit 24 which demodulates the received signal.

The image input module 30 processes an image signal and converts the image signal into image data which may be displayed through the display device DD. The audio input module 40 receives an external sound signal by using a microphone in a recording mode, a voice recognition mode, etc., and converts the received sound signal into electrical sound data. The audio output module 50 converts audio data received from the wireless communication module 20 or audio data stored in the memory 60, and outputs the converted audio data from the electronic apparatus ED.

The external interface module 70 serves as an interface which connects to, for example, an external charger, wired/wireless data ports, a card socket (for example, a memory card, a SIM/UIM card), etc.

The power supply module PSM supplies power used for the overall operation of the electronic apparatus ED. The power supply module PSM may include a general battery device.

The housing HM illustrated in FIG. 2 is coupled to the display device DD, in particular, to the window WM, and accommodates the modules described above. FIG. 2 illustratively shows the housing HM made of a single member. However, the housing HM is not limited thereto. For example, according to embodiments, the housing HM may include two or more components which are attached to each other.

The electronic optical module ELM may be an electronic component that outputs or receives an optical signal. The electronic optical module ELM transmits or receives an optical signal through a partial area of the display device DD that corresponds to the second non-display area TA. In an embodiment, the electronic optical module ELM may include a camera module CM. The camera module CM receives a natural light signal NL (see FIG. 2) through the second non-display area TA (see FIG. 2) and captures an external image. The electronic optical module ELM may include, for example, a proximity sensor or an ultraviolet light emitting sensor.

The electronic optical module ELM is disposed below the display device DD. The electronic optical module ELM overlaps the second non-display area TA of the display device DD. The second non-display area TA of the display device DD has a light transmittance higher than that of other areas of the display device DD. Hereinafter, the display device DD will be described in more detail.

Figure 4A:
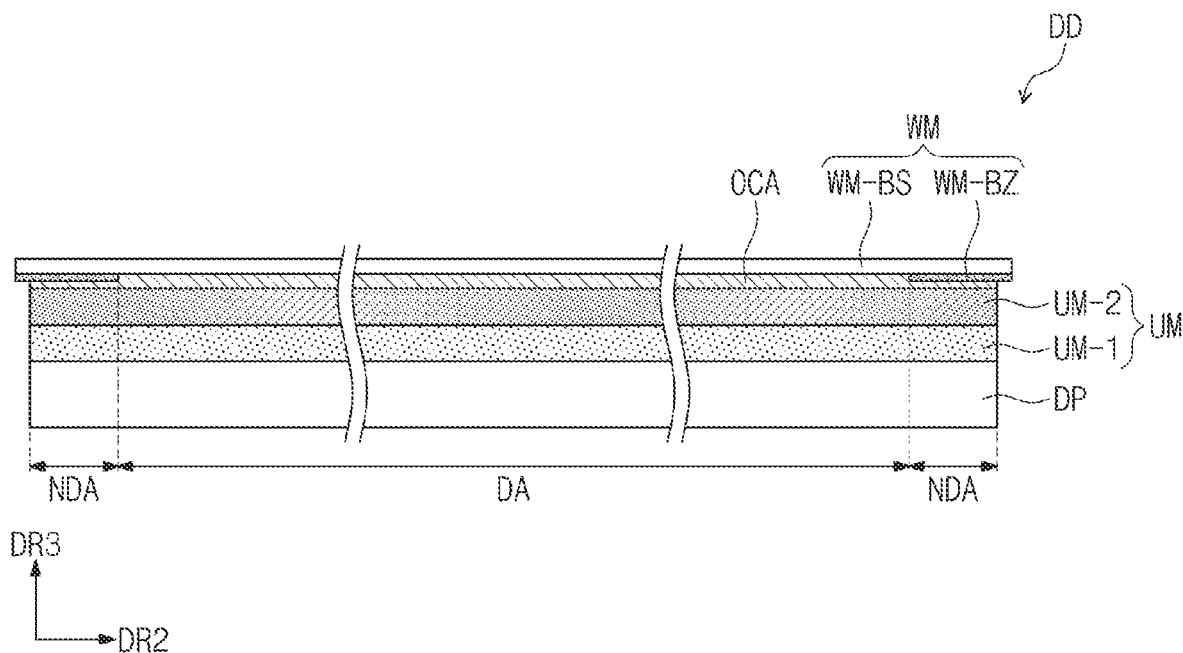
FIGS. 4A and 4B are cross-sectional views of a display device according to an embodiment of the inventive concept.
Figure 4B:
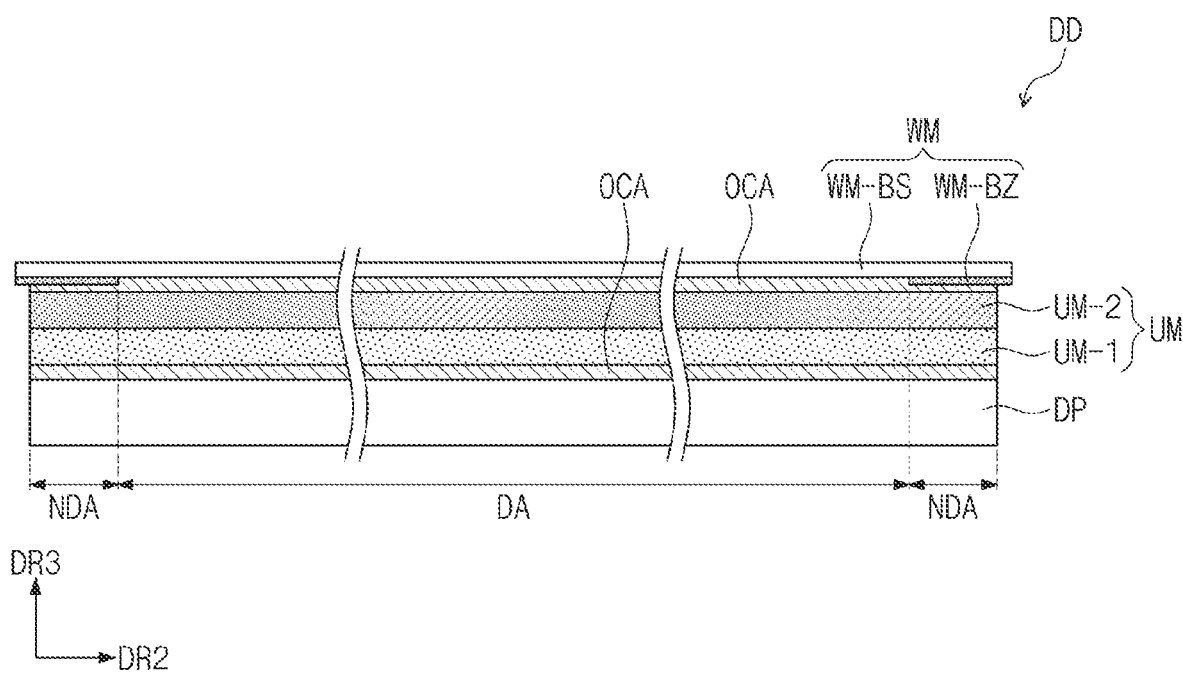

FIGS. 4A and 4B are cross-sectional views of a display device DD according to an embodiment of the inventive concept. Hereinafter, for convenience of explanation, a further detailed description of components and technical aspects previously described may be omitted.

As illustrated in FIGS. 4A and 4B, in an embodiment, the display device DD include a display panel DP, an upper member UM, and a window WM. The upper member UM includes an input detection sensor UM-1 and an optical film UM-2. As illustrated in FIGS. 4A and 4B, the window WM and the optical film UM-2 may be coupled to each other through an adhesive layer OCA.

The optical film UM-2 may have a multi-layer structure, and the multi-layer structure may include an adhesive layer. The adhesive layer may bond the optical film UM-2 to a top surface of the input detection sensor UM-1.

An opening area corresponding to the second non-display area TA illustrated in FIG. 2 may be provided in the optical film UM-2. The opening area may increase transmittance of the natural light signal NL.

As illustrated in FIGS. 4A and 4B, the window WM may include a base substrate WM-BS and a bezel pattern WM-BZ. The base substrate WM-BS may include a transparent substrate such as a glass substrate. The bezel pattern WM-BZ may have a multi-layer structure. The multi-layer structure may include a colored-color layer and a black-light blocking layer. The colored-color layer and the black-light blocking layer may be formed through, for example, deposition, printing, and coating processes.

The input detection sensor UM-1 illustrated in FIG. 4A may be disposed directly on a base surface provided by the display panel DP. Herein, when it is described that "a component B is disposed directly on a component A", it may mean that a separate bonding layer/adhesive layer is not disposed between the component A and the component B. For example, after formation of the component A, the component B may be formed through a consecutive process on the base surface provided by the component A.

As illustrated in FIG. 4B, the input detection sensor UM-1 may be separately manufactured and then coupled to the display panel DP. An adhesive layer OCA may be disposed between the input detection sensor UM-1 and the display panel DP.

Figure 5A:
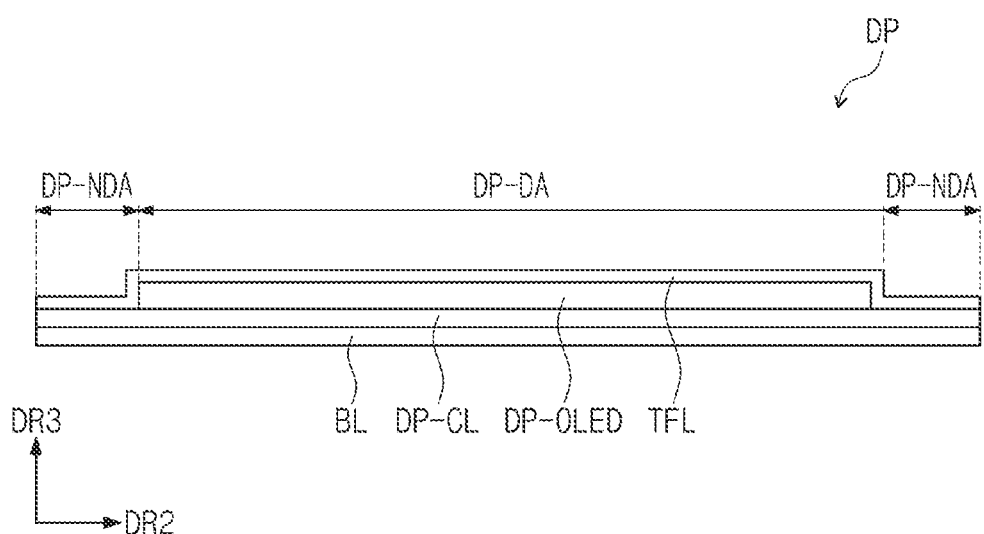
FIG. 5A is a cross-sectional view of a display panel according to an embodiment of the inventive concept.
Figure 5B:
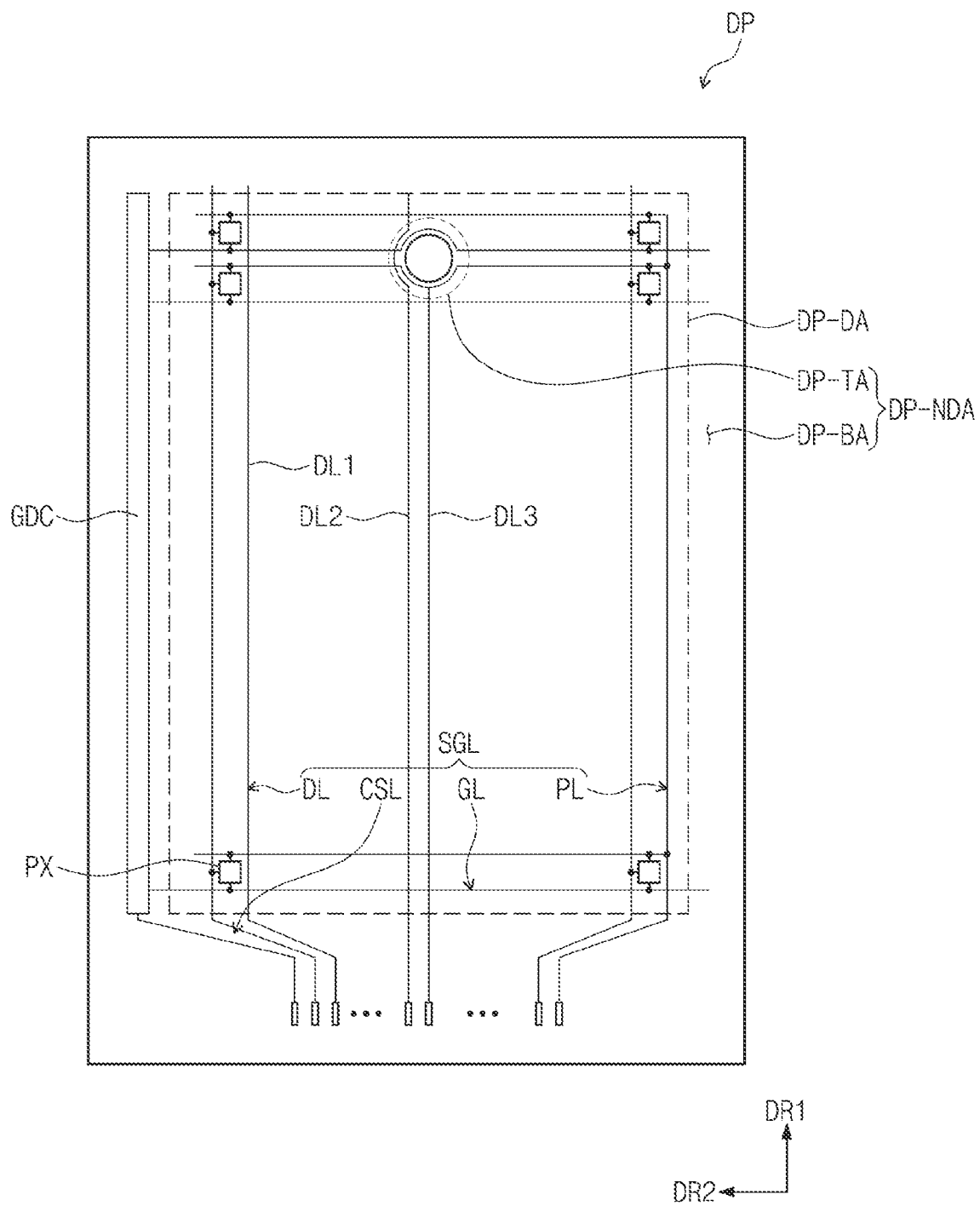
FIG. 5B is a plan view of a display panel according to an embodiment of the inventive concept.
Figure 5C:
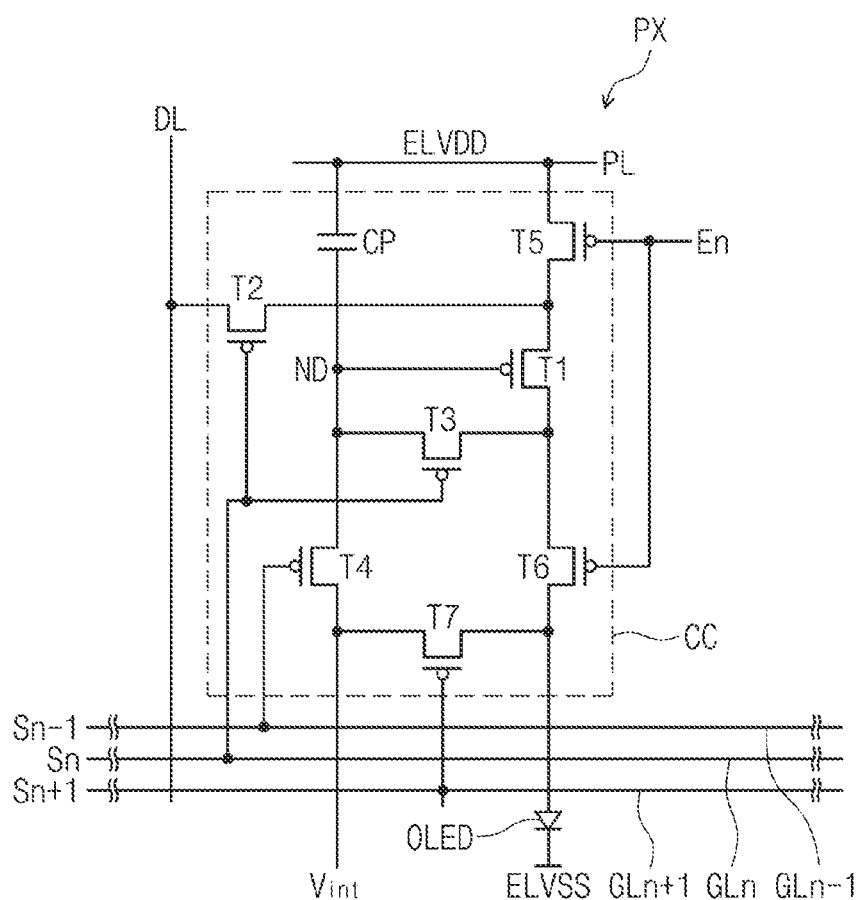
FIG. 5C is an equivalent circuit diagram of a pixel according to an embodiment of the inventive concept.

FIG. 5A is a cross-sectional view of a display panel DP according to an embodiment of the inventive concept. FIG. 5B is a plan view of a display panel DP according to an embodiment of the inventive concept. FIG. 5C is an equivalent circuit diagram of a pixel PX according to an embodiment of the inventive concept.

As illustrated in FIG. 5A, in an embodiment, the display panel DP includes a base layer BL, a circuit element layer DP-CL disposed on the base layer BL, a display element layer DP-OLED, and an upper insulating layer TFL. The base layer BL may include, for example a plastic substrate, a glass substrate, a metal substrate, or an organic/inorganic composite material substrate. The base layer BL may include at least one polyimide layer.

The circuit element layer DP-CL may include at least one insulating layer, semiconductor patterns, and conductive patterns. The insulating layer may include at least one inorganic layer and at least one organic layer. The semiconductor patterns and the conductive patterns may constitute signal lines, a pixel driving circuit, and a scan driving circuit, which will be described in further detail below.

The display element layer DP-OLED includes a display element, for example, an organic light emitting diode. The display element layer DP-OLED may further include an organic layer such as a pixel defining layer.

The upper insulating layer TFL may include a plurality of thin films. Some thin films may improve optical efficiency, and other thin films may protect organic light emitting diodes. The upper insulating layer TFL may include a thin film encapsulation layer having a stack structure of an inorganic layer/an organic layer/an inorganic layer.

As illustrated in FIG. 5B, an active area DP-DA and a non-active area DP-NDA, corresponding to the display area DA (see FIG. 1) and the non-display area NDA (see FIG. 1), respectively, may be defined in the display panel DP. Herein, a description that different members correspond to each other may mean that these areas overlap each other, but is not limited to meaning that the different members have the same surface area/shape. In an embodiment, the active area DP-DA may be defined as a first area. The non-active area DP-NDA may include a first non-active area DP-BA and a second non-active area DP-TA which correspond to the first non-display area BZA and the second non-display area TA, respectively. In an embodiment, the second non-active area DP-TA may be defined as a second area.

The display panel DP may include a plurality of signal lines SGL, a plurality of pixels PX, and a driving circuit GDC. The pixels PX are arranged in the first area DP-DA. Each of the pixels PX includes an organic light emitting diode and a pixel driving circuit connected to the organic light emitting diode. The signal lines SGL and the pixel driving circuit may be included in the circuit element layer DP-CL illustrated in FIG. 5A.

The pixels PX are not arranged in the second area DP-TA. The optical signal moves through the second area DP-TA. The second area DP-TA has light transmittance higher than that of the first area DP-DA.

The driving circuit GDC is disposed in the first non-active area DP-BA. In an embodiment, the driving circuit GDC may include a scan driving circuit. The scan driving circuit generates a plurality of scan signals and sequentially outputs the scan signals to a plurality of scan lines GL, which will be described in further detail below. The scan driving circuit may further output another control signal to the driving circuit of the pixel PX.

The scan driving circuit may include a plurality of thin film transistors which is formed by the same process as the driving circuit of the pixels PX. This process may be, for example, a low temperature polycrystalline silicon (LTPS) process or a low temperature polycrystalline oxide (LTPO) process.

The signal lines SGL include scan lines GL, data lines DL, a power line PL, and a control signal line CSL. The signal lines SGL may further include separate reset lines and light emitting lines. Each of the scan lines GL is connected to corresponding pixels PX of the pixels PX, and each of the data lines DL is connected to corresponding pixels PX of the pixels PX. The power line PL is connected to the pixels PX. The control signal line CSL may provide control signals to the scan driving circuit.

The signal lines SGL may be connected to a circuit board. For example, the signal lines SGL may be connected to an integrated chip-type timing control circuit mounted to the circuit board.

As illustrated in FIG. 5B, the data lines DL may include three types of data lines DL1, DL2 and DL3. A first type of data line DL1 is connected to all pixels PX arranged in a corresponding pixel column. The first type of data line DL1 is further away from the second non-active area DP-TA compared to a second type of data line DL2 and a third type of data line DL3. For example, a distance between the second non-active area DP-TA and the first type of data line DL1 may be greater than each of a distance between the second non-active area DP-TA and the second type of data line DL2 and a distance between the second non-active area DP-TA and the third type of data line DL3. The second type of data line DL2 is connected to all pixels PX arranged in a corresponding pixel column and is disposed adjacent to the second non-active area DP-TA. Also, the second type of data line DL2 is connected to a portion of pixels PX which are arranged in another pixel column adjacent to the corresponding pixel column. A portion of the second type of data line DL2 extends along the second non-active area DP-TA. This will be described in further detail below. The third type of data line DL3 is connected to a portion of pixels PX arranged in a corresponding pixel column and is shorter than the first type of data line DL1. For example, the length of the third type of data line DL3 in the first direction DR1 may be less than the length of the first type of data line DL1 in the first direction DR1. An end of the third type of data line DL3 may be disposed adjacent to the second non-active area DP-TA.

FIG. 5C illustrates one pixel PX disposed in an n-th pixel row, in which n is a natural number. The pixel PX may include an organic light emitting diode OLED and a pixel driving circuit CC. The pixel PX may be connected to an (n−1)-th scan line GLn−1, an n-th scan line GLn, and an (n+1)-th scan line GLn+1. The pixel PX may be connected to an n-th reset line and an n-th light emitting line.

The pixel driving circuit CC may include a plurality of transistors T1 to T7 and a capacitor CP. In response to a data signal, the pixel driving circuit CC controls an amount of current that flows through the organic light emitting diode OLED.

The organic light emitting diode OLED may emit light at a predetermined luminance level in response to the amount of current provided from the pixel driving circuit CC. To this end, a level of first power ELVDD may be set to be higher than a level of second power ELVSS.

Each of the plurality of transistors T1 to T7 may include an input electrode (or a source), an output electrode (or a drain), and a control electrode (or a gate).

The input electrode of the first transistor T1 is connected to the first power ELVDD via the fifth transistor T5, and the output electrode thereof is connected to a first electrode of the organic light emitting diode OLED via the sixth transistor T6. In response to voltage applied to the control electrode, the first transistor T1 controls the amount of current flowing through the organic light emitting diode OLED. The first transistor T1 may be a driving transistor.

The second transistor T2 is connected between a data line DL and the input electrode of the first transistor T1. The control electrode of the second transistor T2 is connected to the n-th scan line GLn. The second transistor T2 is turned on by an n-th scan signal Sn applied to the n-th scan line GLn and electrically connects the data line DL and the input electrode of the first transistor T1.

The third transistor T3 is connected between the output electrode and the control electrode of the first transistor T1. The control electrode of the third transistor T3 is connected to the n-th scan line GLn. The third transistor T3 is turned on by the n-th scan signal Sn and electrically connects the output electrode and the control electrode of the first transistor T1. Thus, when the third transistor T3 is turned on, the first transistor T1 is connected in the form of a diode and thus, may be referred to as a diode-connected transistor.

The fourth transistor T4 is connected between a reference node ND and an initialization power generating part. The control electrode of the fourth transistor T4 is connected to the (n−1)-th scan line GLn−1. The fourth transistor T4 is turned on by an (n−1)-th scan signal Sn−1 applied to the (n−1)-th scan line GLn−1 and provides an initialization voltage Vint to the reference node ND. The initialization voltage Vint may be provided through an n-th reset line.

The fifth transistor T5 is connected between a power line PL and the input electrode of the first transistor T1. The control electrode of the fifth transistor T5 is connected to an n-th light emitting line. The fifth transistor T5 is turned on by an n-th light emitting signal En.

The sixth transistor T6 is connected between the output electrode of the first transistor T1 and the first electrode of the organic light emitting diode OLED. The control electrode of the sixth transistor T6 is connected to the n-th light emitting line. The sixth transistor T6 is turned on by the n-th light emitting signal En.

The seventh transistor T7 is connected between the initialization power generating part and the first electrode of the organic light emitting diode OLED. The control electrode of the seventh transistor T7 receives an (n+1)-th scan signal Sn+1 through the (n+1)-th scan line GLn+1. The seventh transistor T7 provides the initialization voltage Vint to the first electrode of the organic light emitting diode OLED in response to the (n+1)-th scan signal Sn+1.

In FIG. 5C, the transistors T1 to T7 are illustrated as being implemented as PMOS transistors. However, the inventive concept is not limited thereto. For example, according to embodiments, the pixel PX may be implemented using NMOS transistors, or the pixel PX may be implemented using a combination of NMOS and PMOS transistors.

The configuration of the pixel driving circuit CC is not limited to the circuit illustrated in FIG. 5C. For example, in an embodiment of the inventive concept, the pixel driving circuit CC may be embodied in various forms that allow the organic light emitting diode OLED to emit light.

Figure 6A:
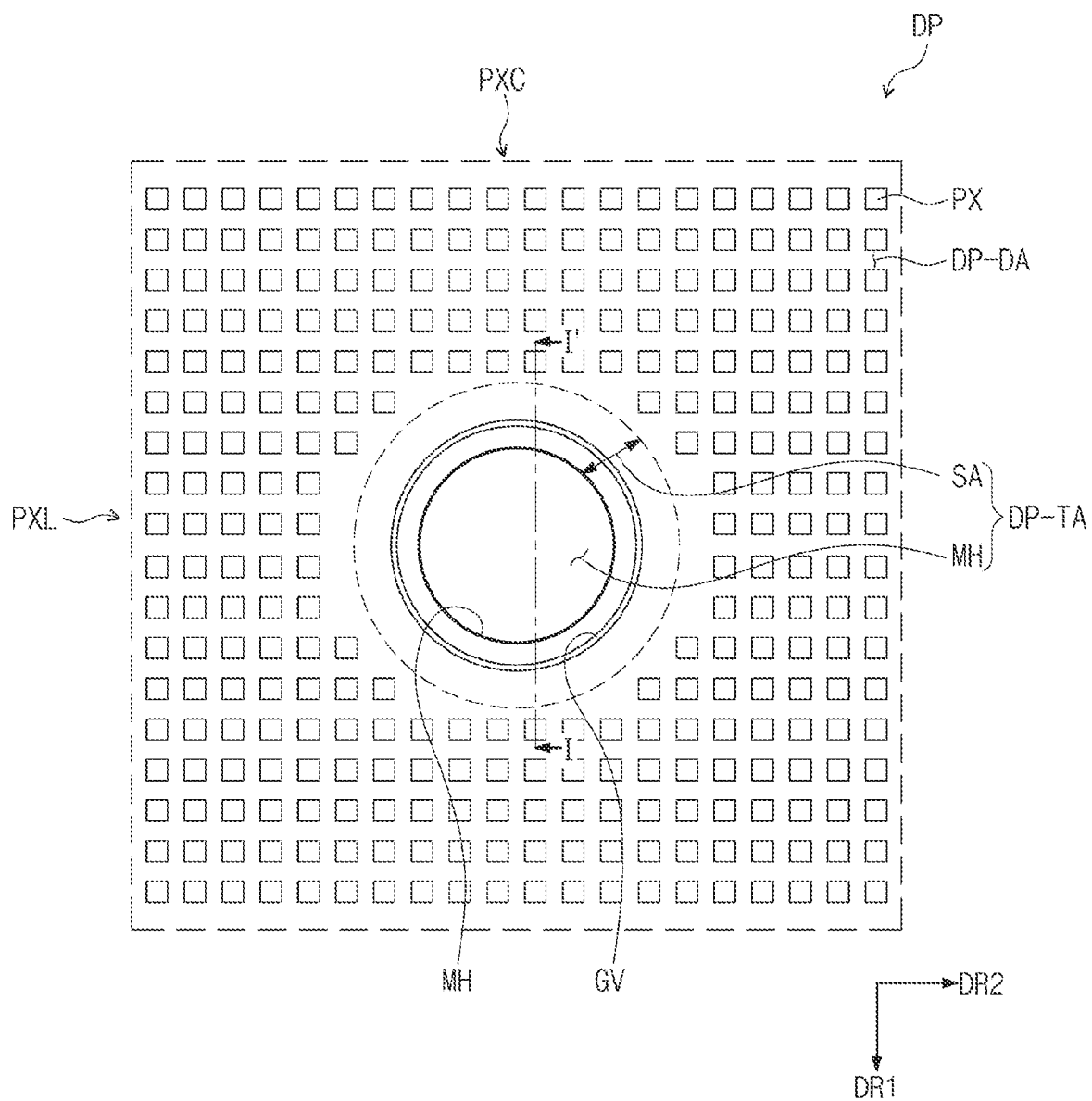
FIG. 6A is an enlarged plan view of a display panel according to an embodiment of the inventive concept.
Figure 6B:
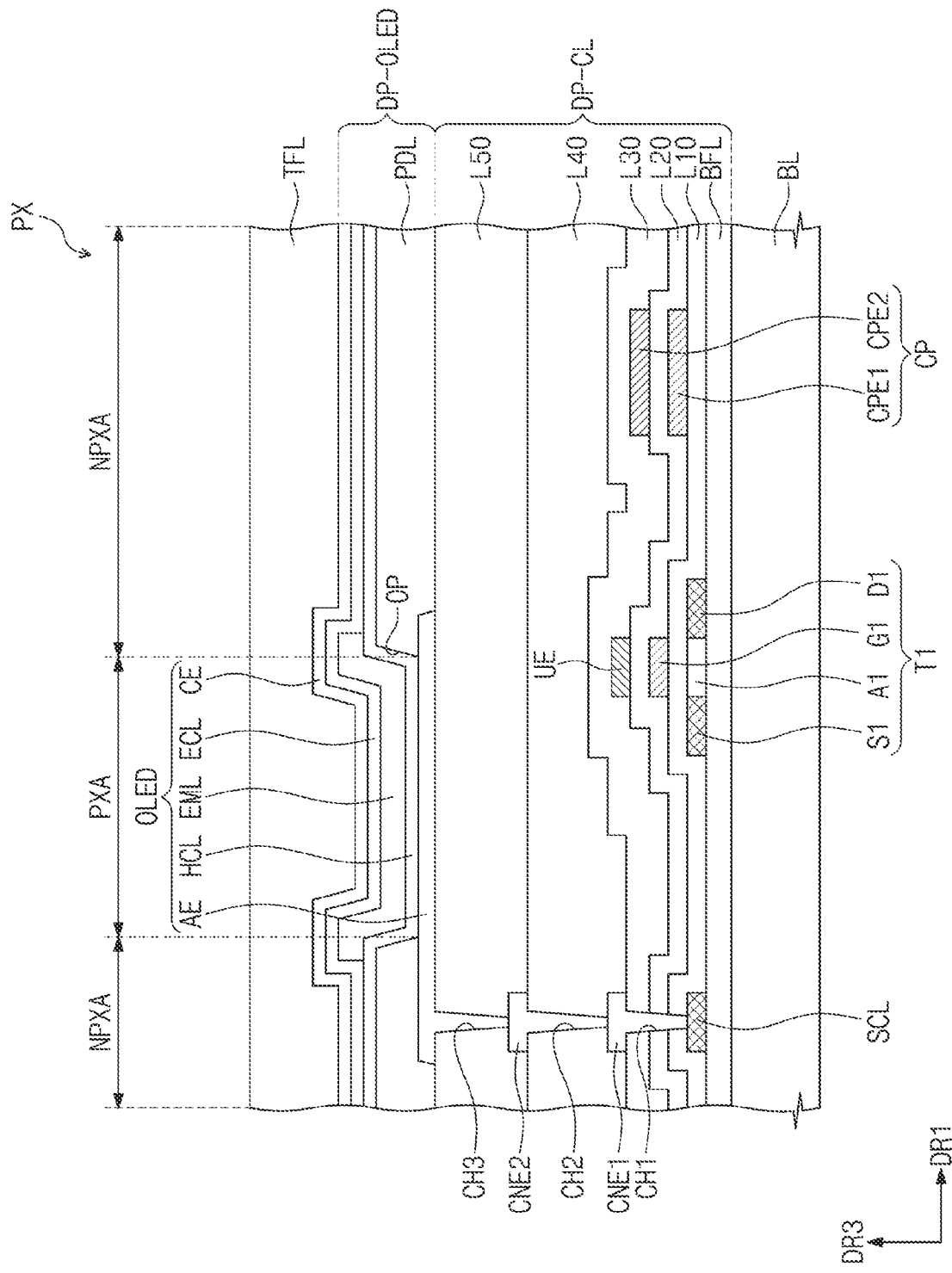
FIGS. 6B and 6C are cross-sectional views of a display panel according to an embodiment of the inventive concept.
Figure 6C:
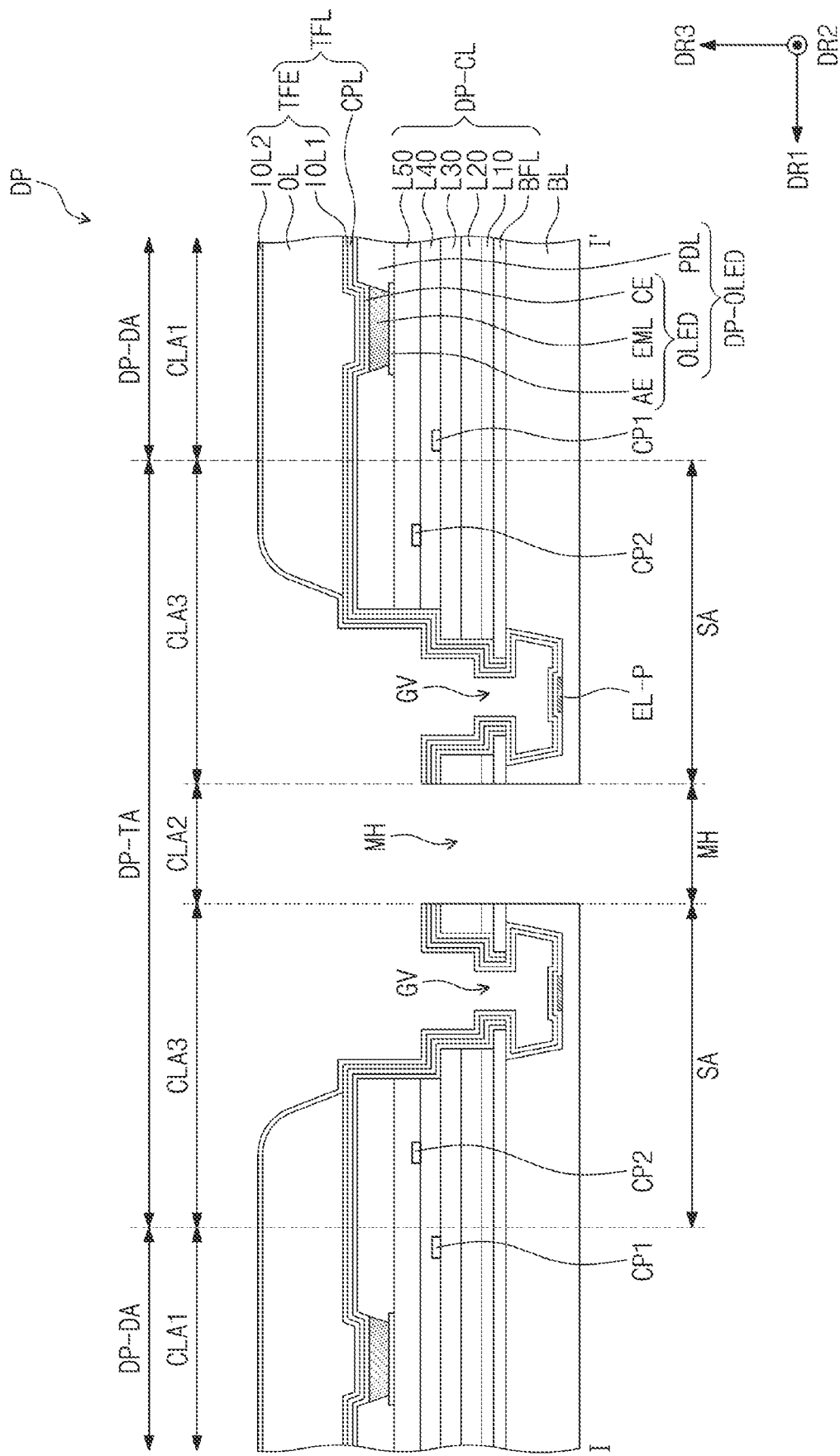

FIG. 6A is an enlarged plan view of a display panel DP according to an embodiment of the inventive concept. FIGS. 6B and 6C are cross-sectional views of a display panel DP according to an embodiment of the inventive concept.

FIG. 6A illustrates the second area DP-TA and the first area DP-DA around the second area DP-TA according to an embodiment of the inventive concept. FIG. 6A illustrates pixels PX that define a plurality of pixel rows PXL and a plurality of pixel columns PXC. The pixels PX arranged in the second direction DR2 define a pixel row PXL, and the pixels PX arranged in the first direction DR1 define a pixel column PXC. The second area DP-TA cuts off a portion of the pixel rows PXL and a portion of the pixel columns PXC. For example, pixels PX belonging to the same pixel row PXL or the same pixel column PXC which extends in a direction that intersects the second area DP-TA may be separated from each other by the second area DP-TA. For example, pixel rows PXL and pixel columns PXC extending in a direction that intersects the second area DP-TA may include pixels PX which are disposed in a direction extending toward the second area DP-TA, are not disposed in the second area DP-TA upon reaching a side of the second area DP-TA, and are again disposed on the opposite side of the second area DP-TA. Thus, the second area DP-TA may be described as separating, or cutting off, some of the pixel rows PXL and some of the pixel columns PXC.

FIG. 6B illustrates a cross-section of a pixel PX, which includes one transistor T1 constituting a pixel circuit and an organic light emitting diode OLED. A base layer BL may include a synthetic resin layer. The synthetic resin layer is formed on a support substrate which is used when a display panel DP is manufactured. Subsequently, a conductive layer, an insulating layer, etc. are formed on the synthetic resin layer. When the support substrate is removed, the synthetic resin layer corresponds to the base layer BL.

In an embodiment, the circuit element layer DP-CL may include inorganic layers such as, for example, a buffer layer BFL, a first intermediate inorganic layer L10, a second intermediate inorganic layer L20, and a third intermediate inorganic layer L30, and may also include organic layers such as, for example, a first intermediate organic layer L40 and a second intermediate organic layer L50.

A semiconductor pattern is disposed on the buffer layer BFL. The semiconductor pattern may include a silicon semiconductor. A first semiconductor pattern may include polysilicon. However, the inventive concept is not limited thereto. For example, in an embodiment, the first semiconductor pattern may include amorphous silicon. In an embodiment, the semiconductor pattern may include a metal oxide semiconductor.

The semiconductor pattern exhibits different electrical characteristics depending on whether the semiconductor pattern is doped. The semiconductor pattern may include a doped area and a non-doped area. The doped area may be doped with an N-type dopant or a P-type dopant. A P-type transistor may include a doped area which is doped with the P-type dopant.

The doped area has a conductivity greater than that of the non-doped area and substantially serves as an electrode or a signal line. The non-doped area serves substantially as an active area (or a channel) of a transistor. That is, a portion of the semiconductor pattern may be an active area (or a channel) of a transistor, another portion of the semiconductor pattern may be a source (or an input electrode area) or a drain (or an output electrode area) of the transistor, and other portions thereof may be a connection signal line (or a connection electrode).

As illustrated in FIG. 6B, a source S1, an active area A1, and a drain D1 of the transistor T1 are formed from the semiconductor pattern. A portion of a connection signal line SCL formed from the semiconductor pattern is also illustrated in FIG. 6B. The connection signal line SCL may be connected, in a plan view, to a transistor (e.g., the sixth transistor T6 in FIG. 5C) constituting the pixel circuit.

A control electrode G1 overlaps the active area A1 and is disposed on the first intermediate inorganic layer L10. A first capacitor electrode CPE1 of a capacitor CP is disposed on the first intermediate inorganic layer L10. A second capacitor electrode CPE2 of the capacitor CP is disposed on the second intermediate inorganic layer L20. An upper electrode UE overlapping the control electrode G1 is disposed on the second intermediate inorganic layer L20.

A first connection electrode CNE1 may be disposed on the third intermediate inorganic layer L30. The first connection electrode CNE1 may be connected to the connection signal line SCL via a first through-hole CH1. A second connection electrode CNE2 may be disposed on the first intermediate organic layer L40. The second connection electrode CNE2 may be connected to the first connection electrode CNE1 via a second through-hole CH2. Conductive patterns different from the first connection electrode CNE1 may be disposed on the third intermediate inorganic layer L30, and conductive patterns different from the second connection electrode CNE2 may be disposed on the first intermediate organic layer L40. Such conductive patterns may constitute a signal line illustrated in FIG. 5B, for example, the data line DL. Thus, the various data lines described herein may be included in layers of the circuit element layer DP-CL.

A first electrode AE is disposed on the second intermediate organic layer L50. The first electrode AE may be connected to the second connection electrode CNE2 via a third through-hole CH3. A light emitting opening OP is defined in a pixel defining layer PDL. The light emitting opening OP of the pixel defining layer PDL allows at least a portion of the first electrode AE to be exposed through the pixel defining layer PDL.

The first area DP-DA may include a light emitting area PXA and a non-light emitting area NPXA adjacent to the light emitting area PXA. The non-light emitting area NPXA may surround the light emitting area PXA. In an embodiment, the light emitting area PXA is defined as an area corresponding to a partial area of the first electrode AE exposed through the light emitting opening OP. For example, in an embodiment, the size of the light emitting area PXA may correspond to the size of the portion of the first electrode AE exposed through the light emitting opening OP.

A hole control layer HCL may be disposed in common in the light emitting area PXA and the non-light emitting area NPXA. That is, the hole control layer HCL may be disposed in both the light emitting area PXA and the non-light emitting area NPXA. The hole control layer HCL may include a hole transport layer and may further include a hole injection layer. A light emitting layer EML is disposed on the hole control layer HCL. The light emitting layer EML may be disposed in an area corresponding to the light emitting opening OP. That is, the light emitting layer EML may be separately provided for each of the pixels PX. The light emitting layer EML may include an organic material and/or an inorganic material. The light emitting layer EML may generate color light having a predetermined color.

An electron control layer ECL is disposed on the light emitting layer EML. The electron control layer ECL may include an electron transport layer and may further include an electron injection layer. The hole control layer HCL and the electron control layer ECL may be commonly formed in common in the plurality of pixels by using an open mask. A second electrode CE is disposed on the electron control layer ECL. The second electrode CE is disposed in common in the plurality of pixels.

An upper insulating layer TFL is disposed on the second electrode CE. The upper insulating layer TFL may include a plurality of thin films.

FIG. 6C illustrates a cross-sectional view taken along line I-I' of FIG. 6A. In FIG. 6C, the organic light emitting diode OLED is schematically illustrated, and the transistor T1 and the capacitor CP of FIG. 6B are not illustrated.

The upper insulating layer TFL is illustrated in more detail in FIG. 6C compared to FIG. 6B. In an embodiment, the upper insulating layer TFL may include a capping layer CPL and a thin film encapsulation layer TFE. The thin film encapsulation layer TFE may include a first organic layer IOL1, an organic layer OL, and a second inorganic layer IOL2.

The capping layer CPL is disposed on the second electrode CE and is in contact (e.g., direct contact) with the second electrode CE. The capping layer CPL may include an organic material. The first inorganic layer IOL1 is disposed on the capping layer CPL and is in contact (e.g., direct contact) with the capping layer CPL. The organic layer OL is disposed on the first inorganic layer IOL1 and is in contact (e.g., direct contact) with the first inorganic layer IOL1. The second inorganic layer IOL2 is disposed on the organic layer OL and is in contact (e.g., direct contact) with the organic layer OL.

The capping layer CPL, which is obtained from a subsequent process such as, for example, a sputtering process, may protect the second electrode CE and may improve light emitting efficiency of the organic light emitting diode OLED. The capping layer CPL may have a refractive index higher than that of the first inorganic layer IOL1.

The first inorganic layer IOL1 and the second inorganic layer IOL2 may protect the display element layer DP-OLED against moisture/oxygen, and the organic layer OL may protect the display element layer DP-OLED against impurities such as dust particles. Each of the first inorganic layer IOL1 and the second inorganic layer IOL2 may be any one of, for example, a silicon nitride layer, a silicon oxynitride layer, or a silicon oxide layer. In an embodiment, each of the first inorganic layer IOL1 and the second inorganic layer IOL2 may include, for example, a titanium oxide layer, an aluminum oxide layer, etc. The organic layer OL may include an acryl-based organic layer, but is not limited thereto.

In an embodiment of the inventive concept, an inorganic layer such as, for example, a lithium fluoride (LiF) layer, may be additionally disposed between the capping layer CPL and the first inorganic layer IOL1. The LiF layer may improve light emitting efficiency of the organic light emitting diode OLED.

Referring to FIG. 6C, in an embodiment, a signal transmission area MH may be defined inside the second area DP-TA. In an embodiment, the signal transmission area MH may be a signal transmission hole. The signal transmission hole is an opening area (or an opening) defined from the bottom surface of the display panel DP to the top surface of the display panel DP, and passing through the display panel DP. For example, the signal transmission hole may fully penetrate the display panel DP from the bottom surface of the display panel DP to the top surface of the display panel DP. In an embodiment, the bottom surface of the base layer BL corresponds to the bottom surface of the display panel DP, and the top surface of the second inorganic layer IOL2 corresponds to the top surface of the display panel DP.

The second area DP-TA includes a peripheral area SA adjacent to the signal transmission area MH. The peripheral area SA may surround the signal transmission area MH. The thickness of the signal transmission area MH may be less than the thickness of the peripheral area SA. A recess pattern GV may be disposed in the peripheral area SA. Unlike the signal transmission hole, the recess pattern GV does not pass entirely through the display panel DP. The recess pattern GV may be defined along an edge of the signal transmission hole. In an embodiment according to FIGS. 6A to 6C, the recess pattern GV is illustrated as a closed line surrounding the signal transmission hole, and is also illustrated as having a circular shape similar to the shape of the signal transmission hole. However, this is merely illustrated as an example, and the inventive concept is not limited thereto. For example, according to embodiments, the recess pattern GV may have a shape different from that of the signal transmission hole such as, for example, a polygonal shape, an elliptical shape, or a closed line shape of which at least a portion is a curve. Also, the recess pattern GV may be provided with a shape having a plurality of partially cut patterns. However, the recess pattern GV is not limited to the examples described above.

The recess pattern GV passes through the circuit element layer DP-CL and extends to a groove provided in the base layer BL. A deposition pattern EL-P may be disposed inside the recess pattern GV. The deposition pattern EL-P is formed by depositing a deposition material into the groove of the base layer BL during a deposition process of the organic light emitting diode OLED.

The deposition pattern EL-P may include a layer including the same material as the light emitting layer EML and a layer including the same material as the second electrode CE. The deposition pattern EL-P may further include a layer including the same material as the hole control layer HCL and a layer including the same material as the electron control layer ECL.

A portion of each of the first inorganic layer IOL1 and the second inorganic layer IOL2 which covers the deposition pattern EL-P may be disposed inside the recess pattern GV. The first inorganic layer IOL1 and the second inorganic layer IOL2 may cover the inner surfaces of the recess pattern GV.

The recess pattern GV may have an undercut shape. In a cross-section, an inlet of the recess pattern GV is narrower than the inner space thereof. The first intermediate organic layer L40 and the second intermediate organic layer L50 are sealed by the recess pattern GV. Moisture or air, which may flow into the organic light emitting diode OLED, the first intermediate organic layer L40, and the second intermediate organic layer L50, may be blocked by the recess pattern GV.

Each of the base layer BL, the circuit element layer DP-CL, the display element layer DP-OLED, and the upper insulating layer TFL may include a plurality of areas. For example, each of the base layer BL, the circuit element layer DP-CL, the display element layer DP-OLED, and the upper insulating layer TFL may include a first circuit area to a fourth circuit area.

FIG. 6C illustrates a first circuit area CLA1, a second circuit area CLA2, and a third circuit area CLA3 in the circuit element layer DP-CL. The first circuit area CLA1 corresponds to the first area DP-DA of the display panel DP. The second circuit area CLA2 corresponds to the signal transmission area MH of the display panel DP. The third circuit area CLA3 corresponds to the peripheral area SA of the display panel DP.

A signal line may be disposed in the third circuit area CLA3. The signal line may be a conductive pattern formed through the same process as the first connection electrode CNE1 or the second connection electrode CNE2 described with reference to FIG. 6B. FIG. 6C illustrates a first signal line CP1 disposed on the third intermediate inorganic layer L30 and a second signal line CP2 disposed on the first intermediate organic layer L40. The first signal line CP1 and the second signal line CP2 are signal lines distinguished from each other, and may be connected to each other via a contact hole passing through the third intermediate inorganic layer L30. That is, the first signal line CP1 and the second signal line CP2 may be parts of a single line disposed on different layers.

Figure 7:
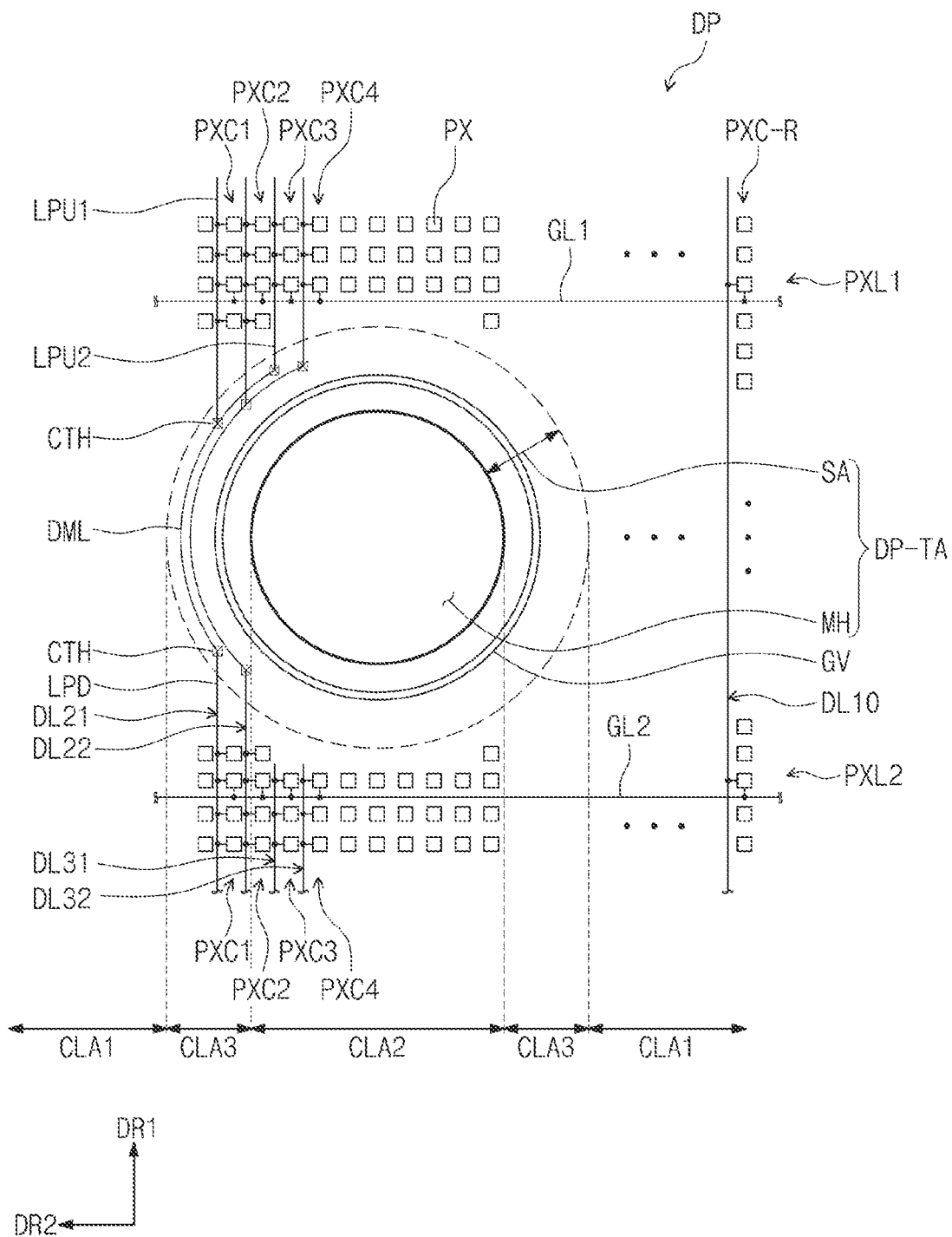
FIG. 7 is an enlarged plan view of a display panel according to an embodiment of the inventive concept.

FIG. 7 is an enlarged plan view of a display panel DP according to an embodiment of the inventive concept. FIG. 7 is illustrated in more detail compared to FIG. 6A. For convenience of explanation, a further detailed description of elements and technical aspects previously described may be omitted.

In FIG. 7, compared to FIG. 6A, four consecutive pixel columns PXC1, PXC2, PXC3, and PXC4 are illustrated in more detail. The four pixel columns PXC1, PXC2, PXC3, and PXC4 are cut off by the second area DP-TA. For example, each of the four pixel columns PXC1, PXC2, PXC3, and PCX4 may extend in the first direction DR1 toward the second area DP-TA until the four pixel columns PXC1, PXC2, PXC3, and PCX4 reach the second area DP-TA. After reaching, and being cut off by the second area DP-TA, the four pixel columns PXC1, PXC2, PXC3, and PXC4 may continue extending in the first direction DR1 on an opposite side of the second area DP-TA. For example, as shown in FIG. 7, the four pixel columns PXC1, PXC2, PXC3, and PXC4 may extend downward in the first direction DR1 until they reach and are cut off by a top portion of the second area DP-TA, and the four pixel columns PXC1, PXC2, PXC3, and PXC4 may continue extending downward in the first direction DR1 from an opposite lower portion of the second area DP-TA after being cut off by the second area DP-TA. Thus, each of the four pixel columns PXC1, PXC2, PXC3, and PXC4 may be described as being spatially separated by the second area DP-TA. In embodiments, pixels PX in a single pixel column may be uniformly spaced apart from each other except for the area in which the pixels PX are cut off by the second area DP-TA. Unlike the four pixel columns PXC1, PXC2, PXC3, and PXC4, one pixel column PXC-R (hereinafter, referred to as a reference pixel column or a fifth pixel column), which is not cut off by the second area DP-TA, is also illustrated in FIG. 7.

Referring to FIG. 7, in an embodiment, the first data line DL21 may be connected to a first group of pixels PX arranged below the second area DP-TA in the first pixel column PXC1, a second group of pixels PX arranged above the second area DP-TA in the first pixel column PXC1, and a third group of pixels PX arranged above the second area DP-TA in the third pixel column PXC3. In addition, the second data line DL22 may be connected to a fourth group of pixels PX arranged below the second area DP-TA in the second pixel column PXC2, a fifth group of pixels PX arranged above the second area DP-TA in the second pixel column PXC2, and a sixth group of pixels PX arranged above the second area DP-TA in the fourth pixel column PXC4. Further, the fifth data line DL32 may be connected to a seventh group of pixels PX arranged below the second area DP-TA in the fourth pixel column PXC4.

In an embodiment, pixels that display the same color may be disposed in each of pixel columns. For example, pixels PX (or first pixels) in the first pixel column PXC1 may generate red color light, pixels PX (or second pixels) in the second pixel column PXC2 may generate green color light, pixels PX (or third pixels) in the third pixel column PXC3 may generate blue color light, and pixels PX (or fourth pixels) in the fourth pixel column PXC4 may generate green color light. The four pixel columns PXC1, PXC2, PXC3, and PXC4 may be arranged repeatedly in the second direction DR2.

In an embodiment, the first pixel column PXC1 and the third pixel column PXC3 may include two types of pixels PX, and the second pixel column PXC2 and the fourth pixel column PXC4 may include one type of pixel PX. For example, the first pixel column PXC1 and the third pixel column PXC3 may include a first type of pixels PX, for example, red pixels PX, and a second type of pixels PX, for example, blue pixels PX, which are alternately disposed in the second direction DR2. The pixel arrangement of the first pixel column PXC1 and the third pixel column PXC3 may be the same as or different from each other. The second pixel column PXC2 and the fourth pixel column PXC4 may include green pixels PX.

The pixels PX disposed in the same pixel row in the four pixel columns PXC1, PXC2, PXC3, and PXC4 and the reference pixel column PXC-R are connected to the same scan lines GL1 and GL2. The scan lines GL1 and GL2 illustrated in FIG. 7 correspond to the n-th scan line GLn illustrated in FIG. 5C, and additional scan lines connected to the pixels PX are not illustrated for convenience of illustration.

For convenience of description, pixels PX of the four pixel columns PXC1, PXC2, PXC3, and PXC4 and the reference pixel column PXC-R, which are connected to one scan line GL1, are defined as a first pixel row PXL1. Also, pixels PX of the four pixel columns PXC1, PXC2, PXC3, and PXC4 and the reference pixel column PXC-R, which are connected to another scan line GL2, are defined as a second pixel row PXL2. The four pixel columns PXC1, PXC2, PXC3, and PXC4 may be described as being sequentially arranged in a pixel row direction (e.g., a direction corresponding to the first and second pixel rows PXL1 and PXL2) that is perpendicular to the direction in which the four pixel columns PXC1, PXC2, PXC3, and PXC4 extend.

The four pixel columns PXC1, PXC2, PXC3, and PXC4 and the reference pixel column PXC-R are connected to data lines DL21, DL22, DL31, DL32, and DL10, respectively. The data line DL10 may be referred to as a first data line, the data line DL21 may be referred to as a second data line, the data line DL22 may be referred to as a third data line, the data line DL31 may be referred to as a fourth data line, and the data line DL32 may be referred to as a fifth data line. The first data line DL10 connected to the reference pixel column PXC-R corresponds to the first type of data line DL1 illustrated in FIG. 5B. As shown in FIG. 7, in an embodiment, a portion of each of the second data line DL21 and the third data line DL22 may overlap the peripheral area SA of the second area DP-TA.

FIG. 7 illustrates the second data line DL21 and the third data line DL22 which correspond to the second type of data line DL2 illustrated in FIG. 5B. The fourth data line DL31 and the fifth data line DL32 are also illustrated, which correspond to the third type of data line DL3 illustrated in FIG. 5B. Each of the second data line DL21 and the third data line DL22 may be connected to both pixels PX in one pixel column and a portion of pixels PX in another pixel column. For example, pixels PX in the first pixel column PXC1 and pixels PX in the third pixel column PXC3 may be connected to the second data line DL21 via a first part LPU1, a second part LPU2, a third part LPD, a fourth part DML, and contact holes CTH, which are described in further detail below. In addition, pixels PX in the second pixel column PXC2 and the fourth pixel column PXC4 may be connected to the third data line DL22 via a first part LPU1, a second part LPU2, a third part LPD, a fourth part DML, and contact holes CTH, which are described in further detail below. Each of the fourth data line DL31 and the fifth data line DL32 may be connected to a remaining portion of the pixels PX in another pixel column Here, the portion of the pixels and the remaining portion of the pixels are disposed on opposite sides of the second area DP-TA in the first direction DR1. The number of pixels PX connected to each of the second data line DL21 and the third data line DL22 is greater than the number of pixels PX connected to each of the fourth data line DL31 and the fifth data line DL32.

The pixels PX of the first pixel column PXC1 and a portion of the pixels PX of the third pixel column PXC3 may be connected to the second data line DL21. A remaining portion of the pixels PX of the third pixel column PXC3, for example, the pixels PX of the third pixel column PXC3 disposed below the second area DP-TA in FIG. 7, may be connected to the fourth data line DL31. The pixels PX of the second pixel column PXC2 and a portion of the pixels PX of the fourth pixel column PXC4 may be connected to the third data line DL22. A remaining portion of the pixels PX of the fourth pixel column PXC4, for example, the pixels PX of the fourth pixel column PXC4 disposed below the second area DP-TA in FIG. 7, may be connected to the fifth data line DL32.

The pixel PX of the first pixel column PXC1 and the pixel PX of the third pixel column PXC3, which are disposed in the first pixel row PXL1 and connected to the second data line DL21, may generate light having the same color, that is, may display the same color. Each of the second data line DL21 and the third data line DL22 may have four distinguishable parts LPU1, LPU2, LPD and DML, which are described below.

A first part LPU1 (or a first one side part) and a second part LPU2 (or a second one side part) may be disposed on an upper side (or one side) of the second area DP-TA in the first direction DR1. The first part LPU1 is connected to the pixels PX which are disposed on the upper side of the second area DP-TA in the corresponding pixel column. The second part LPU2 is connected to the pixels PX which are disposed on the upper side of the second area DP-TA in another pixel column which is different form the corresponding pixel column.

A third part LPD (or an opposite side part) is disposed on a lower side (or an opposite side) of the second area DP-TA in the first direction DR1. The third part LPD is connected to the pixels PX which are disposed on the lower side of the second area DP-TA in the corresponding pixel column in the first direction DR1.

A fourth part DML (or a connection part), which is disposed in the peripheral area SA, connects the first part LPU1 and the second part LPU2 to the third part LPD. The fourth part DML may be disposed on a layer different from those of the first part LPU1, the second part LPU2, and the third part LPD. The first part LPU1, the second part LPU2, and the third part LPD may be disposed on the same layer as one of the first signal line CP1 and the second signal line CP2, and the fourth part DML may be disposed on the same layer as the other one of the first signal line CP1 and the second signal line CP2. Thus, the first part LPU1, the second part LPU2, and the third part LPD may be disposed on a different layer than the layer on which the fourth part DML is disposed on. The fourth part DML is connected to the first part LPU1, the second part LPU2, and the third part LPD via a contact hole CTH passing through an insulating layer.

As described above, the pixels of different pixel columns are connected by one data line, and thus, the number of signal lines disposed in the peripheral area SA may be reduced. As a result, a short circuit of the signal lines may be prevented, and the size of the peripheral area SA, which is a non-display area, may be reduced.

Figure 8:
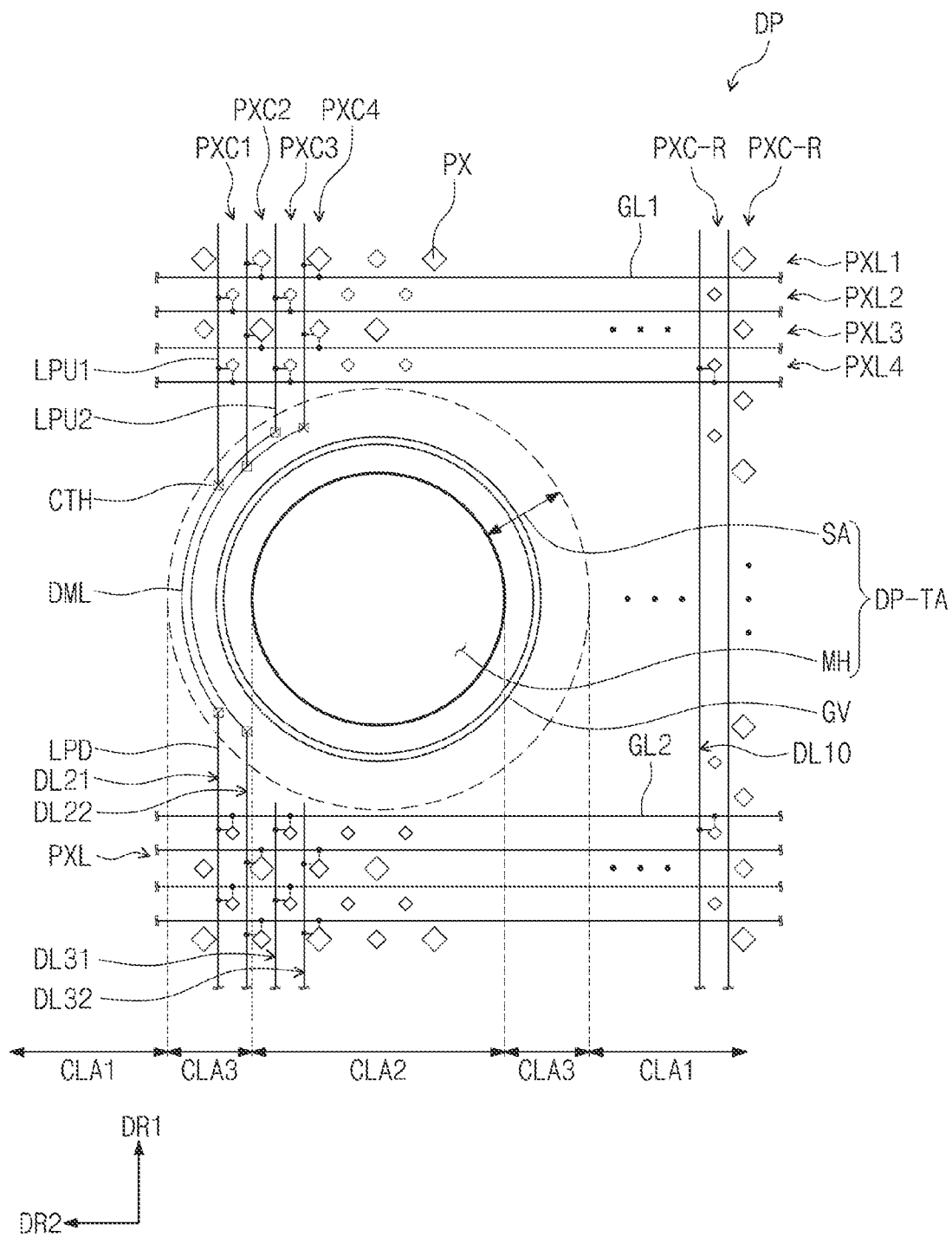
FIG. 8 is an enlarged plan view of a display panel according to an embodiment of the inventive concept.

FIG. 8 is an enlarged plan view of a display panel DP according to an embodiment of the inventive concept. The display panel DP of FIG. 8 is different from the display panel DP of FIG. 7 in terms of the arrangement of the pixels PX, and thus, the arrangement of the pixels PX will be mainly described.

FIG. 8 separately illustrates four pixel rows PXL1, PXL2, PXL3, and PXL4 connected to four scan lines, respectively, arranged in a first direction. In an embodiment, the first pixel row PXL1 and the third pixel row PXL3 may include two types of pixels PX, and the second pixel row PXL2 and the fourth pixel row PXL4 may include one type of pixel PX. For example, the first pixel row PXL1 and the third pixel row PXL3 may include red pixels PX and blue pixels PX, which are alternately disposed in the first direction DR1. The pixel arrangement of the first pixel row PXL1 and the third pixel row PXL3 may be the same as or different from each other. The second pixel row PXL2 and the fourth pixel row PXL4 may include green pixels PX. The four pixel rows PXL1, PXL2, PXL3, and PXL4 may be arranged repeatedly in the first direction DR1.

One pixel of a second pixel column PXC2 and one pixel of a fourth pixel column PXC4 are connected to a first scan line of four scan lines, and define a first pixel row PXL1. One pixel of a first pixel column PXC1 and one pixel of a third pixel column PXC3 are connected to a second scan line of the four scan lines, and define a second pixel row PXL2. Another pixel of the second pixel column PXC2 and another pixel of the fourth pixel column PXC4 are connected to a third scan line of the four scan lines, and define a third pixel row PXL3. Another pixel of the first pixel column PXC1 and another pixel of the third pixel column PXC3 are connected to a fourth scan line of the four scan lines, and define a fourth pixel row PXL4.

In an embodiment, the first pixel column PXC1 and the third pixel column PXC3 may include one type of pixel PX. The second pixel column PXC2 and the fourth pixel column PXC4 may include two types of pixels PX. For example, the first pixel column PXC1 and the third pixel column PXC3 may include green pixels PX arranged in a second direction DR2. The second pixel column PXC2 and the fourth pixel column PXC4 may include red pixels PX and blue pixels PX, which are alternately disposed in the second direction DR2. The pixel arrangement of the second pixel column PXC2 and the fourth pixel column PXC4 may be the same as or different from each other.

Figure 9A:
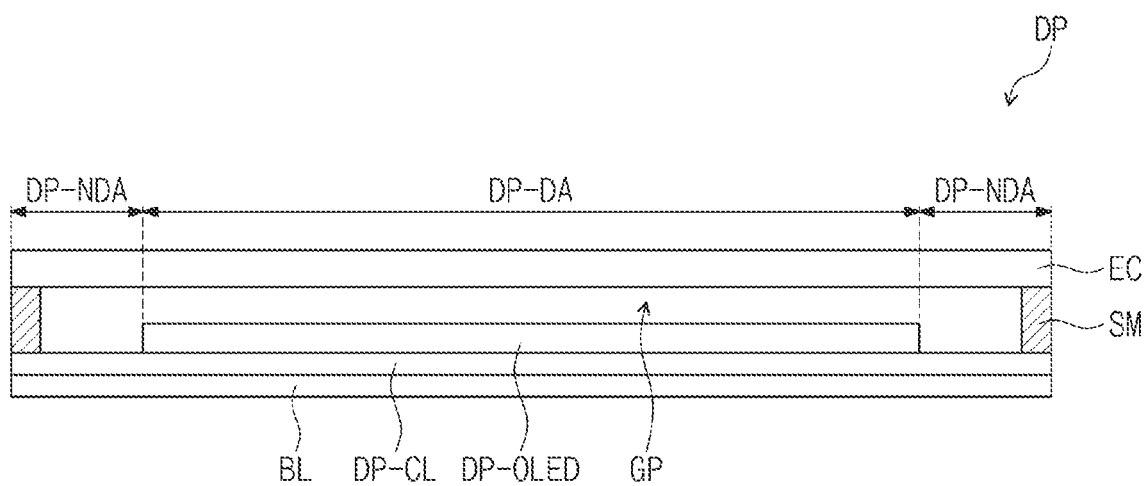
FIG. 9A is a cross-sectional view of a display panel according to an embodiment of the inventive concept.
Figure 9B:
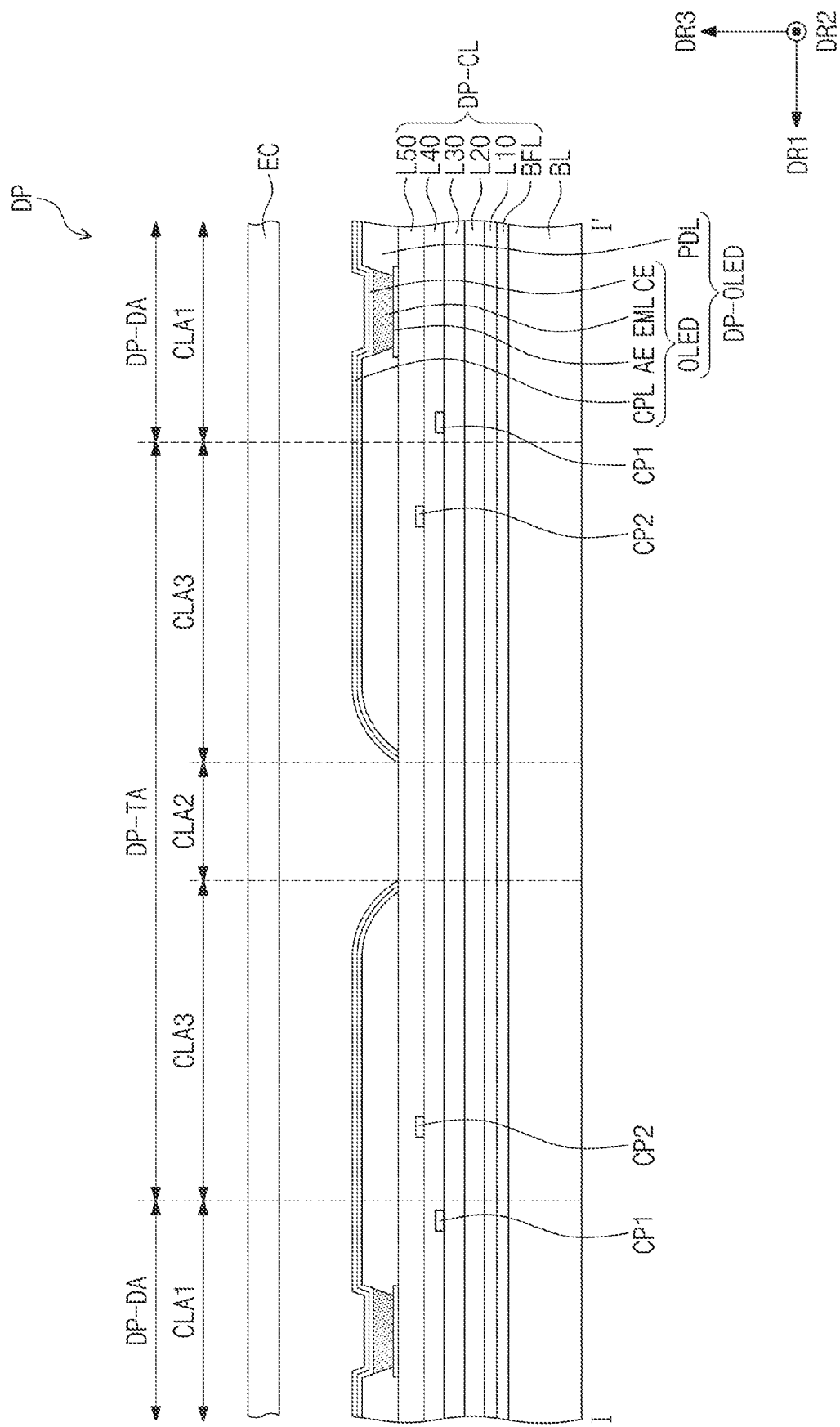
FIG. 9B is an enlarged cross-sectional view of a display panel according to an embodiment of the inventive concept.

FIG. 9A is a cross-sectional view of a display panel DP according to an embodiment of the inventive concept. FIG. 9B is an enlarged cross-sectional view of a display panel DP according to an embodiment of the inventive concept.

Compared to the display panels DP illustrated in FIGS. 5A and 6C, the display panel DP according to an embodiment illustrated in FIGS. 9A and 9B does not include the upper insulating layer TFL. Rather, the display panel DP according to an embodiment illustrated in FIGS. 9A and 9B includes an encapsulation substrate EC and a sealing member SM. A base layer BL may include a glass substrate. In addition, the base layer BL may include a substrate having a substantially constant refractive index in a visible light wavelength range.

The encapsulation substrate EC may be a transparent substrate. The encapsulation substrate EC may include a glass substrate. In addition, the encapsulation substrate EC may include a substrate having a substantially constant refractive index in a visible light wavelength range. The sealing member SM may couple a lower display substrate and the encapsulation substrate EC. The sealing member SM may extend along an edge of the encapsulation substrate EC.

A gap GP defined inside the display panel DP may be filled with air or an inert gas (hereinafter, referred to as an outside gas). The encapsulation substrate EC and the sealing member SM may prevent moisture from permeating the lower display substrate. For example, the encapsulation substrate EC and the sealing member SM may seal the display element layer DP-OLED.

The sealing member SM may include an inorganic adhesive layer such as a frit. However, the inventive concept is not limited thereto. For example, in an embodiment, the sealing member SM may include an organic adhesive layer. In an embodiment, since the display panel DP may be completely sealed from the outside, the strength thereof may be enhanced, and a failure of a light emitting element may be prevented.

Unlike the display panel DP illustrated in FIG. 6C, a module hole MH is not defined in the display panel DP according to an embodiment illustrated in FIGS. 9A and 9B. A non-deposition area, which corresponds to at least the module hole MH, is defined in the display panel DP according to an embodiment. The non-deposition area may be a second circuit area CLA2 having a relatively small thickness. The second circuit area CLA2 corresponds to the signal transmission area MH (see FIG. 6C). A third circuit area CLA3 corresponds to the peripheral area SA (see FIG. 6C).

In the non-deposition area, some or all of the circuit element layer DP-CL are not disposed, or some or all of the display element layer DP-OLED is not disposed. Thus, the non-deposition area may have light transmittance higher than that of other areas. In an embodiment illustrated in FIGS. 9A and 9B, the non-deposition area is illustrated as an area in which conductive patterns of the circuit element layer DP-CL are not disposed, and in which all of the display element layer DP-OLED is not disposed.

As described above, a display device according to embodiments of the present inventive concept may provide a wider display area and a narrow non-display area. For example, the surface area of the peripheral area adjacent to the signal transmission area may be reduced. Since the pixels arranged in different pixel columns are connected to the same data line, the number of the data lines arranged in the peripheral area may be reduced.

As is traditional in the field of the present inventive concept, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the present inventive concept has been particularly shown and described with reference to the embodiments thereof, it will be understood by those of ordinary skill in the art that various changes in form and detail may be made therein without departing from the spirit and scope of the present inventive concept as defined by the following claims.

What is claimed is:

1. A display panel, comprising:
a first area in which first pixels of a first pixel column, second pixels of a second pixel column, and third pixels of a third pixel column are arranged;
a second area which cuts off the first pixel column, the second pixel column, and the third pixel column and through which an optical signal travels;
a first data line connected to the first pixels, and connected to a portion of the third pixels arranged on one side of the second area in a direction in which the first to third pixel columns extend;
a second data line connected to the second pixels; and
a third data line connected to a remaining portion of the third pixels arranged on another side of the second area in the direction in which the first to third pixel columns extend.

2. The display panel of claim 1, further comprising:
a first scan line connected to one first pixel of the first pixels arranged on the one side of the second area in the direction in which the first to third pixel columns extend and connected to one third pixel of the third pixels arranged on the one side of the second area in the direction in which the first to third pixel columns extend; and
a second scan line connected to one first pixel of the first pixels arranged on the another side of the second area in the direction in which the first to third pixel columns extend and connected to one third pixel of the third pixels arranged on the another side of the second area in the direction in which the pixel column extends.

3. The display panel of claim 2, wherein the one first pixel and the one third pixel, which are connected to the first scan line, display a same color.

4. The display panel of claim 3, wherein the second pixels display a different color than the one first pixel and the one third pixel which are connected to the first scan line.

5. The display panel of claim 1, wherein the second area comprises:
a signal transmission area through which the optical signal is transmitted and a peripheral area adjacent to the signal transmission area,
wherein a portion of the first data line overlaps the peripheral area.

6. The display panel of claim 5, wherein the signal transmission area passes through the display panel.

7. The display panel of claim 5, further comprising:
a base layer;
at least one insulating layer disposed on the base layer and overlapping the first data line, the second data line, and the third data line; and
a display element layer disposed on the at least one insulating layer,
wherein a thickness of the signal transmission area of the display panel is less than a thickness of the peripheral area.

8. The display panel of claim 7, further comprising:
an encapsulation substrate that seals the display element layer.

9. The display panel of claim 5, wherein the first data line comprises:
a connection part disposed in the peripheral area;
a first part connected to the connection part, disposed on the one side of the second area, and connected to a portion of the first pixels;
a second part connected to the connection part, disposed on the one side of the second area, and connected to the portion of the third pixels; and
a third part connected to the connection part, disposed on the another side of the second area, and connected to the remaining portion of the first pixels.

10. The display panel of claim 9, wherein the first part, the second part, and the third part are disposed on a same layer.

11. The display panel of claim 10, wherein the connection part is disposed on a different layer than the same layer on which the first part, the second part and the third part are disposed.

12. The display panel of claim 1, wherein the first pixel column, the second pixel column, and the third pixel column are sequentially arranged in a pixel row direction perpendicular to the direction in which the first to third pixel columns extend, and
the display panel further comprises a fourth pixel column adjacent to the third pixel column and comprising fourth pixels,
wherein the second data line is connected to a portion of the fourth pixels arranged on the one side of the second area in the direction in which the first to third pixel columns extend.

13. The display panel of claim 12, wherein the second pixels and the fourth pixels display a same color.

14. The display panel of claim 12, wherein one of the second pixels and one of the fourth pixels are connected to a first scan line and define a first pixel row,
one of the first pixels and one of the third pixels are connected to a second scan line and define a second pixel row,
another one of the second pixels and another one of the fourth pixels are connected to a third scan line and define a third pixel row, and
another one of the first pixels and another one of the third pixels are connected to a fourth scan line and define a fourth pixel row,
wherein the first to fourth pixel rows are spaced apart from each other in the direction in which the first to third pixel columns extend.

15. The display panel of claim 1, wherein, in a plan view, the second area is surrounded by the first area.

16. The display panel of claim 1, wherein the first pixels and the third pixels comprise a first type of pixels configured to display a first color and a second type of pixels configured to display a second color, and
a pixel arrangement of the first pixels and a pixel arrangement of the third pixels are different from each other in the direction in which the first to third pixel columns extend.

17. A display panel, comprising:
a first area in which a plurality of pixels is arranged;
a second area in which the plurality of pixels is not arranged,
wherein a light transmittance of the second area is higher than a light transmittance of the first area;
a first data line connected to first pixels of the plurality of pixels arranged on one side of the second area and connected to second pixels of the plurality of pixels arranged on another side of the second area in a first direction; and
a second data line connected to third pixels of the plurality of pixels arranged on the another side of the second area,
wherein a portion of the first pixels connected to the first data line and arranged on the one side of the second area defines a same pixel column as the third pixels connected to the second data line and arranged on the another side of the second area.

18. The display panel of claim 17, wherein a portion of the first data line overlaps the second area.

19. The display panel of claim 17, wherein the second area comprises a signal transmission area passing through the display panel and a peripheral area adjacent to the signal transmission area.

20. The display panel of claim 17, wherein a number of pixels connected to the first data line is greater than a number of pixels connected to the second data line.

21. A display panel, comprising:
a first area in which a plurality of pixels is arranged;
a second area in which the plurality of pixels is not arranged; and
a first data line connected to a first group of the plurality of pixels arranged on a first side of the second area in a first pixel column, connected to a second group of the plurality of pixels arranged on a second side of the second area in the first pixel column, and connected to a third group of the plurality of pixels arranged on the second side of the second area in a third pixel column,
wherein a second pixel column is disposed between the first pixel column and the third pixel column, and the first data line is not connected to a fifth group of the plurality of pixels arranged on the second side of the second area in the second pixel column,
wherein the second side of the second area is opposite to the first side of the second area.

22. The display panel of claim 21, further comprising:
a second data line connected to a fourth group of the plurality of pixels arranged on the first side of the second area in a second pixel column, connected to the fifth group of the plurality of pixels arranged on the second side of the second area in the second pixel column, and connected to a sixth group of the plurality of pixels arranged on the second side of the second area in a fourth pixel column,
wherein the first pixel column, the second pixel column, the third pixel column and the fourth pixel column are sequentially arranged.

23. The display panel of claim 22, further comprising:
a third data line connected to a seventh group of the plurality of pixels arranged on the first side of the second area in the fourth pixel column.

* * * * *